(12) United States Patent
Kim et al.

(10) Patent No.: US 11,989,082 B2
(45) Date of Patent: *May 21, 2024

(54) NON-VOLATILE MEMORY DEVICE, METHOD OF OPERATING THE DEVICE, AND MEMORY SYSTEM INCLUDING THE DEVICE

(71) Applicant: Samsung Electronics Co., Ltd., Suwon-si (KR)

(72) Inventors: Heejin Kim, Suwon-si (KR); Hyunjun Yoon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/057,328

(22) Filed: Nov. 21, 2022

(65) Prior Publication Data
US 2023/0079939 A1  Mar. 16, 2023

Related U.S. Application Data

(63) Continuation of application No. 16/708,988, filed on Dec. 10, 2019, now Pat. No. 11,507,448.

(30) Foreign Application Priority Data

Apr. 5, 2019  (KR) .......................... 10-2019-0040340

(51) Int. Cl.
*G06F 11/07*  (2006.01)
*G06F 12/0882*  (2016.01)
(Continued)

(52) U.S. Cl.
CPC ...... *G06F 11/0778* (2013.01); *G06F 11/0757* (2013.01); *G06F 12/0882* (2013.01);
(Continued)

(58) Field of Classification Search
CPC ............ G06F 11/0778; G06F 11/0757; G06F 12/0882; G06F 13/1673; G06F 2212/1016;
(Continued)

(56) References Cited

U.S. PATENT DOCUMENTS 7,180,780 B1  2/2007  Ho et al.
7,940,567 B2  5/2011  Moon et al.
(Continued)

FOREIGN PATENT DOCUMENTS

| KR | 101373186 B1 | 3/2014 |
|---|---|---|
| KR | 10-2015-0020431 A | 2/2015 |
| KR | 10-2018-0134181 A | 12/2018 |

OTHER PUBLICATIONS

Office Action dated Mar. 28, 2022 for corresponding U.S. Appl. No. 16/708,988.
(Continued)

*Primary Examiner* — Ajay Ojha
(74) *Attorney, Agent, or Firm* — Harness, Dickey & Pierce, P.L.C.

(57) ABSTRACT

A non-volatile memory device, a method of operating the non-volatile memory device, and a memory system including the non-volatile memory device are provided. A non-volatile memory device includes a memory cell array including a plurality of memory cells configured to be each programmed to one state of a plurality of states, a page buffer circuit including a plurality of page buffers configured to each store received data as state data indicating a target state of a corresponding one of the plurality of memory cells, the page buffer circuit being configured to perform a state data reordering operation of changing a first state data order into a second state data order during performance of a program operation on selected memory cells of the plurality of memory cells, and a reordering control circuit configured
(Continued)

to control the page buffer circuit to perform the state data reordering operation simultaneously with the program operation.

20 Claims, 22 Drawing Sheets

(51) Int. Cl.
*G06F 13/16* (2006.01)
*G11C 7/10* (2006.01)
*G11C 11/4074* (2006.01)
*G11C 11/4093* (2006.01)

(52) U.S. Cl.
CPC ........ *G06F 13/1673* (2013.01); *G11C 7/1039* (2013.01); *G11C 7/1087* (2013.01); *G11C 11/4074* (2013.01); *G11C 11/4093* (2013.01)

(58) Field of Classification Search
CPC ..... G06F 2212/7203; G06F 2212/7206; G06F 2212/7208; G06F 12/0238; G06F 12/0246; G11C 7/1039; G11C 7/1087; G11C 11/4074; G11C 11/4093; G11C 7/1006; G11C 16/32; G11C 16/3459; G11C 16/0483; G11C 2211/5642; G11C 2211/5648; G11C 11/5628; G11C 16/10

See application file for complete search history.

(56) References Cited

U.S. PATENT DOCUMENTS

| | | | |
|---|---|---|---|
| 8,325,517 | B2 | 12/2012 | Kim et al. |
| 8,743,604 | B2 | 6/2014 | Chae |
| 9,202,587 | B2 | 12/2015 | Jo et al. |
| 2005/0213393 | A1 | 9/2005 | Lasser |
| 2012/0002469 | A1 | 1/2012 | Imamoto et al. |
| 2015/0199267 | A1 | 7/2015 | Oh et al. |
| 2016/0027525 | A1* | 1/2016 | Kim .................... G11C 11/5628 365/185.12 |
| 2017/0228189 | A1* | 8/2017 | Sudo .................. G11C 16/0483 |
| 2017/0329667 | A1* | 11/2017 | Hirano ................ H03M 13/152 |

OTHER PUBLICATIONS

Office Action for Korean Application No. 10-2019-0040340 dated Dec. 8, 2023.

* cited by examiner

NON-VOLATILE MEMORY DEVICE, METHOD OF OPERATING THE DEVICE, AND MEMORY SYSTEM INCLUDING THE DEVICE

CROSS-REFERENCE TO RELATED APPLICATION

The present application is a continuation of and claims priority under 35 U.S.C. § 120 to U.S. patent application Ser. No. 16/708,988, filed on Dec. 10, 2019, which claims priority to Korean Patent Application No. 10-2019-0040340, filed on Apr. 5, 2019, in the Korean Intellectual Property Office, the disclosure of which is incorporated herein in its entirety by reference.

BACKGROUND

The inventive concepts relates to memory devices, as well as, to non-volatile memory devices configured to store multi-bit data, methods of operating the non-volatile memory devices, and/or memory systems including the non-volatile memory devices.

Memory devices, which are used to store data, may be classified into volatile memory devices and non-volatile memory devices. A flash memory device, an example of a non-volatile memory device, may be applied to a storage device, such as a solid-state drive (SSD), a universal flash storage (UFS), and an embedded multimedia card (eMMC). In recent years, techniques for embodying high-capacity, low-power non-volatile memory devices that enable high-speed input/output (I/O) operations have actively been studied to mount the non-volatile memory devices on mobile devices, such as SSDs or smartphones.

SUMMARY

The inventive concepts provides a non-volatile memory device capable of improving program performance, a method of operating the non-volatile memory device, and/or a memory system including the non-volatile memory device.

According to an aspect of the inventive concepts, there is provided a non-volatile memory device including a memory cell array including a plurality of memory cells, each memory cell configured to be programmed to one state of a plurality of states, a page buffer circuit including a plurality of page buffers, each page buffer configured to store received data as state data indicating a target state of a corresponding memory cell of the plurality of memory cells, the page buffer circuit being configured to perform a state data reordering operation of changing a first state data order indicating reference mapping between a plurality of data values of the state data and the plurality of states into a second state data order during performance of a program operation on selected memory cells of the plurality of memory cells, and a reordering control circuit configured to control the page buffer circuit to perform the state data reordering operation simultaneously with the program operation.

According to another aspect of the inventive concepts, there is provided a method of operating a non-volatile memory device. The method includes receiving data, storing the data as state data in a plurality of page buffers connected to a memory cell array, programming a plurality of memory cells of the memory cell array based on the state data stored in the plurality of page buffers, and changing a data value of the state data stored in each of the plurality of page buffers simultaneously with the programming of the plurality of memory cells to reorder the state data.

According to another aspect of the inventive concepts, there is provided a memory system including a memory controller configured to convert data received from a host, based on a first state data order to generate write data, and a non-volatile memory device configured to store the write data received from the memory controller as state data in each of a plurality of page buffers, program memory cells based on the state data, and perform a state data reordering operation simultaneously with the programming of the memory cells, the state data reordering operation includes changing a value of state data stored in each of the plurality of page buffers to change the first state data order into a second state data order, is the second state data being appropriate for a program sequence.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Embodiments will now be described more fully hereinafter with reference to the accompanying drawings.

Figure 1:
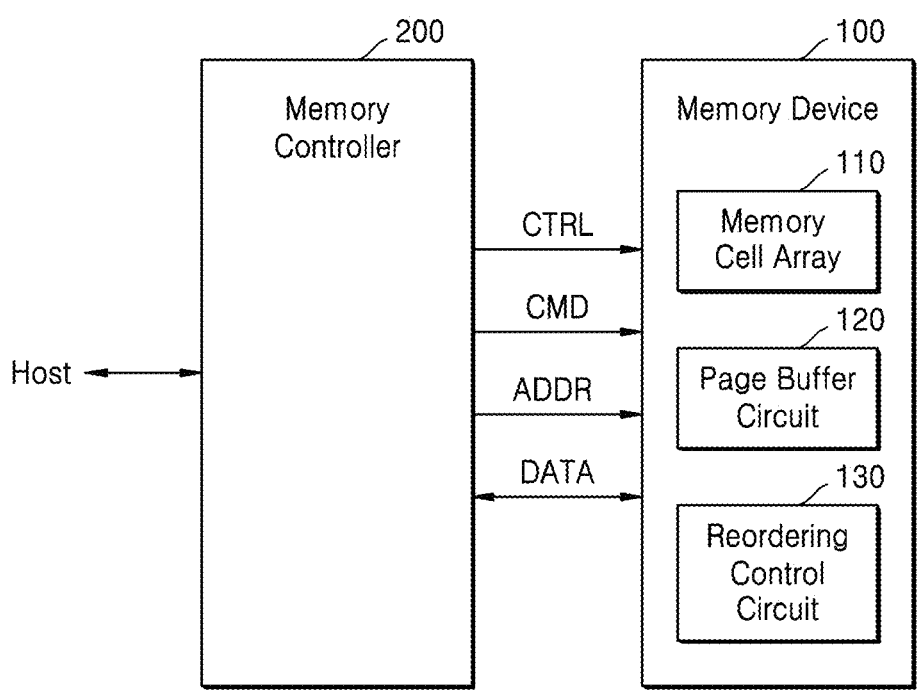
FIG. 1 is a block diagram of a memory system according to some example embodiments.

FIG. 1 is a block diagram of a memory system 10 according to some example embodiments.

Referring to FIG. 1, the memory system 10 may include a memory device 100 and a memory controller 200. The memory device 100 may include a memory cell array 110, a page buffer circuit 120, and a reordering control circuit 130. The memory device 100 may include a non-volatile memory device.

The memory controller 200 may control the memory device 100 to read data stored in the memory device 100 or write data to the memory device 100 in response to a read/write request from a host. The memory controller 200 may be configured to communicate with the outside (e.g., the host) through at least one of various interface protocols, such as a universal serial bus (USB), a multimedia card (MMC), peripheral component interface-express (PCI-E), advanced technology attachment (ATA), serial-ATA (SATA), parallel-ATA (PATA), a small computer system interface (SCSI), an enhanced small device interface (ESDI), and an intelligent drive electronics (IDE). The memory controller 200 may control a program (or write) operation, a read operation, and an erase operation on the memory device 100 by providing an address ADDR, a command CMD, and a control signal CTRL to the memory device 100. Also, data DATA to be programmed and read data DATA may be transceived between the memory controller 200 and the memory device 100.

The memory controller 200 (and other circuitry, such as the page buffer circuit 120 and reordering control circuit 130) may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The memory cell array 110 may include a plurality of memory cells, each of which may store 1-bit data or multi-bit data. For example, the plurality of memory cells may be flash memory cells. Hereinafter, embodiments will be described in detail assuming that the plurality of memory cells are NAND flash memory cells. However, the inventive concepts are not limited thereto, and the plurality of memory cells may be various types of non-volatile memory cells. In some example embodiments, the plurality of memory cells may be resistive memory cells, such as resistive RAM (ReRAM) cells, phase-change RAM (PRAM) cells, or magnetic RAM (MRAM) cells.

In some example embodiments, the memory cell array 110 may include a plurality of cell strings configured to share a bit line therebetween. Each of the plurality of cell strings may include a ground selection transistor, memory cells, and a string selection transistor, which are connected to a ground selection line, word lines, and a string selection line. The memory cell array 110 may be a two-dimensional (2D) memory array. Alternatively, the memory cell array 110 may be a three-dimensional (3D) memory array.

The 3D memory cell array is monolithically formed in at least one physical level of memory cell arrays having an active region provided above a silicon substrate and a circuit associated with the operation of memory cells, wherein the associated circuit may be above or within the silicon substrate. The term "monolithic" means that layers of each level of the 3D memory cell array are directly deposited on the layers of each underlying level of the 3D memory cell array.

In some example embodiments, the 3D memory cell array may include cell strings in which at least one memory cell is located on another memory cell in a vertical direction. The at least one memory cell may include a charge trap layer. The following patent documents, which are hereby incorporated by reference, disclose suitable configurations for 3D memory arrays, in which the 3D memory array is configured at a plurality of levels, with word lines and/or bit lines shared between levels: U.S. Pat. Nos. 7,679,133; 8,553,466; 8,654,587; 8,559,235; and US Pat. Pub. No. 2011/0233648. Also, US Pat. Pub. No. 2014/0334232 and U.S. Pat. No. 8,488,381 are hereby incorporated by reference.

The page buffer circuit 120 may temporarily store data DATA received from the memory controller 200, that is, data DATA to be written to the memory cell array 110. The page buffer circuit 120 may store the data DATA to be written, as state data corresponding to each of memory cells (hereinafter, selected memory cells) connected to a selected word line of the memory cell array 110. In some example embodiments, the state data may indicate one of a plurality of states (e.g., an erase state and a plurality of program states) to which a memory cell may be programmed based on a data value. A mapping relationship between a plurality of data values of the state data and the plurality of states may be referred to as a state data order. The page buffer circuit 120 may drive the selected memory cells based on the state data during a program operation, that is, a program operation, on memory cells. The page buffer circuit 120 may perform a state data reordering operation simultaneously with the program operation to change the state data order.

The reordering control circuit 130 may control the page buffer circuit 120 to perform the state data reordering operation simultaneously with the program operation. Also, the reordering control circuit 130 may select a specific period out of periods in which a program operation is performed (e.g., the entire program period) and control the page buffer circuit 120 to perform a state data reordering operation in the selected period. For example, the entire program period may include a plurality of sub-periods, for example, a plurality of program voltage (or pulse) application periods, a plurality of program recovery periods, and a plurality of verification periods, and the reordering control circuit 130 may select at least one of the plurality of sub-periods and control the page buffer circuit 120 to perform a state data reordering operation in the at least one selected sub-period simultaneously with at least one program operation (e.g., a program voltage application, a recovering operation, and a verification operation) that is set to be performed in the at least one sub-period.

In some example embodiments, the reordering control circuit 130 may divide (or separate) the state data reordering operation (i.e., operations performed for the state data reordering operation) into a plurality of sequences and select a plurality of sub-periods in which the plurality of sequences are to be simultaneously performed, from among the plurality of sub-periods. The page buffer circuit 120 may sequentially perform the plurality of sequences of the state data reordering operation in the plurality of selected sub-periods. For instance, the page buffer circuit 120 may divide the state data reordering operation into a first sequence and a second sequence. The page buffer circuit 120 may perform operations corresponding to the first sequence of the state data reordering operation simultaneously with a corresponding program operation in a selected first sub-period and subsequently, perform operations corresponding to the second sequence of the state data reordering operation simultaneously with a corresponding program operation in a selected second sub-period.

When a write request and data to be written to the memory device 100 are received from the host, the memory controller 200 may convert the data to be written, based on a first state data order (e.g., a default state data order or a reference state data order), which is set considering a coupling effect and an error rate (e.g., an error rate in a read operation on data written to the memory cell array 110), and provide the converted data as write data to the memory device 100.

The page buffer circuit 120 may perform a state data reordering operation to change the first state data order into a second state data order, which is appropriate for a program algorithm (e.g., a program pulse application algorithm and a verification algorithm) that is set for the memory device 100. The reordering control circuit 130 may control the state data reordering operation of the page buffer circuit 120 based on the reordering sequence that is set to change the first state data order into the second state data order. The page buffer circuit 120 may change a data value of state data, which corresponds to each of the selected memory cells stored in the page buffer circuit, based on a reordering control signal provided by the reordering control circuit 130. Since the reordering of the state data may be performed simultaneously with the program operation, as described above, the page buffer circuit 120 may perform the state data reordering operation simultaneously with at least one program operation corresponding thereto in at least one sub-period of a plurality of sub-periods included in a period in which the program operation is performed.

As described above, due to the state data reordering operation, a time required to program the selected memory cells to a plurality of states may be reduced. The state data reordering operation may be performed simultaneously with a specific program operation. For example, the state data reordering operation may be performed as a background operation simultaneously with the specific program operation in at least one sub-period of a plurality of sub-periods included in a program period. Thus, an additional time for the state data reordering operation may not be required. Also, the state data reordering operation may be divided into at least two sequences, which may be performed as a background operation in the at least two sub-periods of the plurality of sub-periods included in the program period. Thus, even if the total time taken for the state data reordering operation exceeds a time during which one program operation is performed, an additional time only for the state data reordering operation may not be required. Accordingly, a time taken to program the selected memory cells with data may be reduced, and accordingly, the program performance of the memory device 100 may be improved and the input/output (I/O) speed of the memory system 10 may be increased.

Figure 2A:
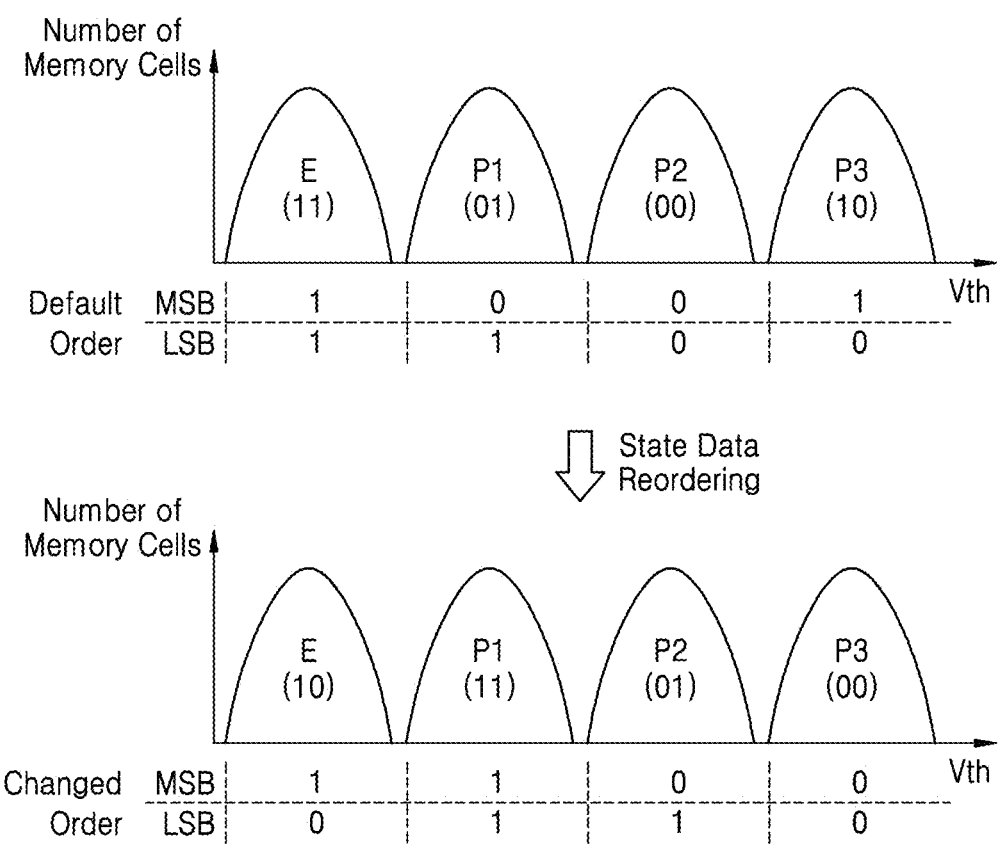
FIGS. 2A and 2B illustrate examples of a state data reordering operation.
Figure 2B:
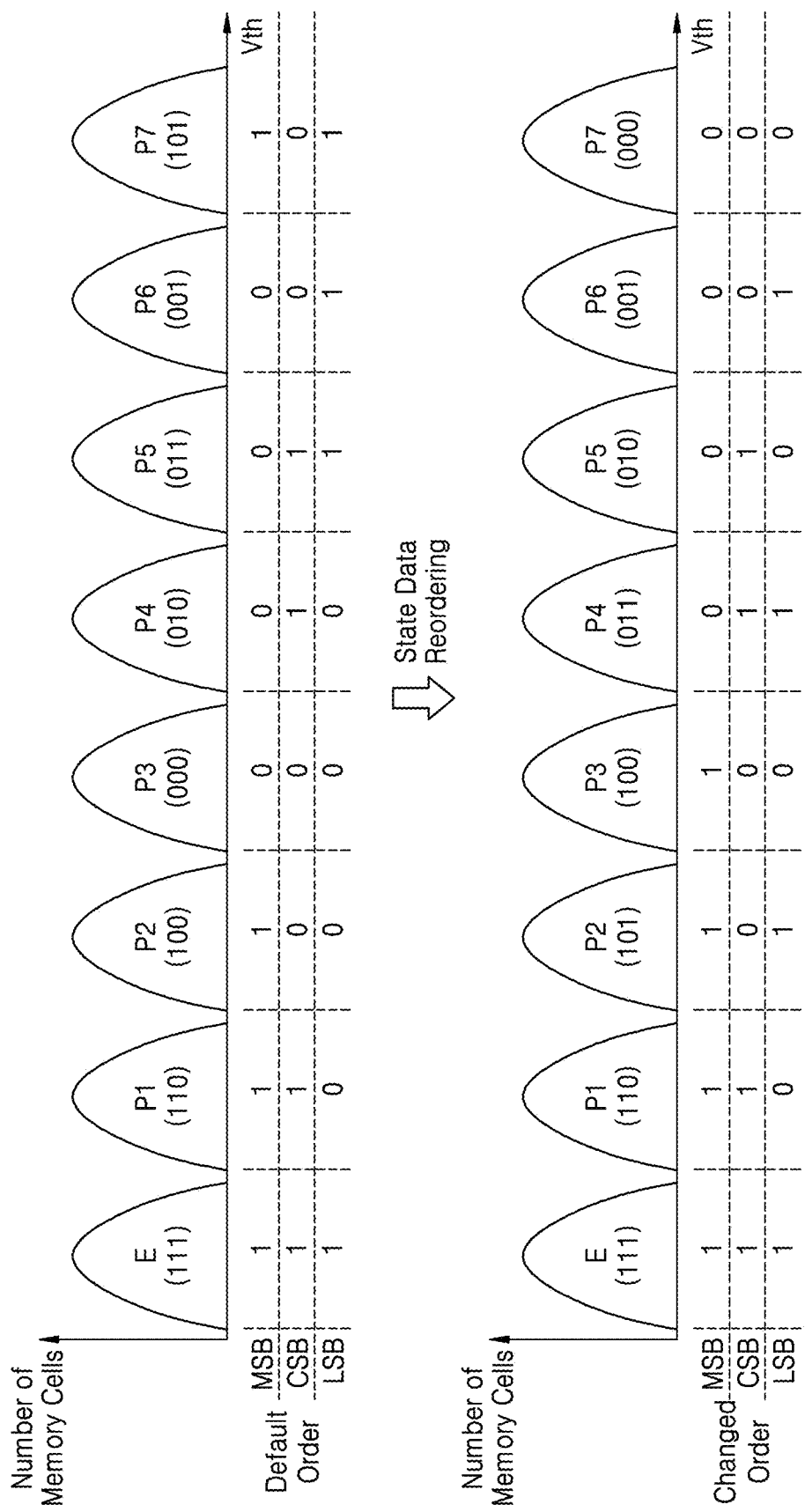

FIGS. 2A and 2B illustrate examples of a state data reordering operation. FIG. 2A illustrates some example embodiments in which a memory cell is programmed with 2-bit data, and FIG. 2B illustrates some example embodiments in which a memory cell is programmed with 3-bit data. In FIGS. 2A and 2B, a curve denotes a distribution of threshold voltages of programmed memory cells, and data denotes a state data order.

Referring to FIG. 2A, 2-bit data may be stored in each of memory cells. Each of the memory cells may be programmed to one of four states, that is, an erase state E and first to third program states P1 to P3, according to 2-bit data corresponding thereto. The 2-bit data may respectively correspond to a least signification bit (LSB) and a most significant bit (MSB). The 2-bit data may indicate a target state in which a corresponding memory cell is to be programmed, out of the four states, and be referred to as state data. The state data may have a plurality of 2-bit data values, that is, '00,' '01,' '10,' and '11,' and mapping (or a mapping relationship) between the four states and the plurality of data values of the state data may be referred to as a state data order. Hereinafter, the 'state data order' may briefly be referred to as an 'order' herein.

A first order of the state data order may be reordered (or changed) into a second order different from the first order. The first order may be a default order (or an initial order) of FIG. 2A, and the second order may be a changed order (or a final order) of FIG. 2A.

According to the default order, data values '11,' '01,' '00,' and '10' of the state data may be sequentially mapped to the erase state E and the first to third program states P1 to P3. The default order may be an order set for the memory controller (refer to 200 in FIG. 1). Write data received from the memory controller 200 may include state data about each of the memory cells according to the default order.

The changed order may be set based on a program algorithm applied to the memory device (refer to 200 in FIG. 1). For example, the changed order may be an order that is set to reduce a time taken for a program operation when the memory device 100 performs the program operation based on the set program algorithm.

According to the changed order, data values '10,' '11,' '01,' and '00' of the state data may be sequentially mapped to the erase state E and the first to third program states P1 to P3.

Figure 3:
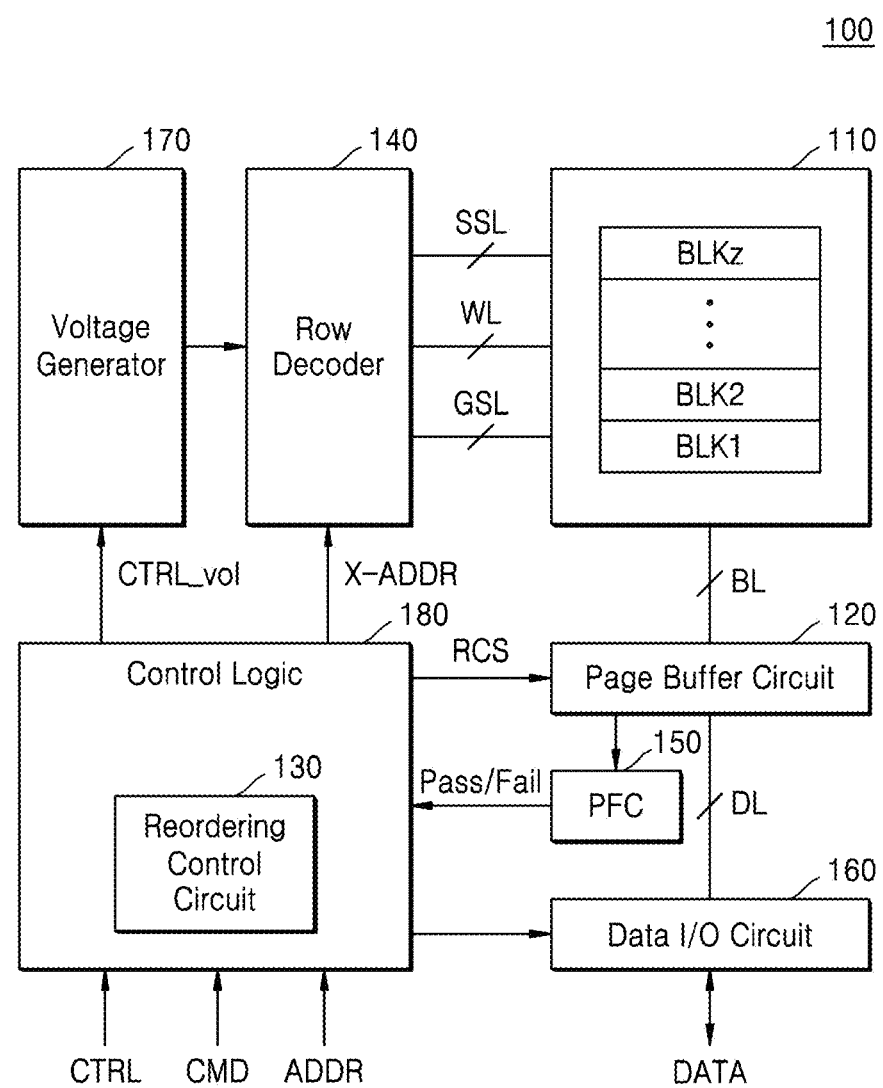
FIG. 3 is a block diagram of a memory device according to some example embodiments.

Referring to FIG. 2B, 3-bit data may be stored in each of memory cells. Each of the memory cells may be programmed to one of eight states, that is, an erase state E and first to seventh program states P1 to P7 according to 3-bit data corresponding thereto. The 3-bit data may respectively correspond to an LSB, a central significant bit (CSB), and an MSB. The 3-bit data, which is state data, may indicate a target state in which a corresponding memory cell is to be programmed, out of eight states. The state data may have a plurality of 3-bit data values, that is, '000,' '001,' '010,' '011,' '100,' '101,' '110,' and '111.' Mapping (or a mapping relationship) between the eight states and the plurality of data values of the state data may be referred to as a state data order.

The state data order may be reordered (or changed) from the first order to the second order. The first order may be a default order of FIG. 2B, and the second order may be a changed order of FIG. 2B. According to the default order, the data values '111,' '110,' '100,' '000,' '010,' '011,' '001,' and '101' of the state data may be respectively mapped to the erase state E and the first to seventh program states P1 to P7. According to the changed order, the data values '111,' '110,' '101,' '100,' '011,' '010,' '001,' and '000' of the state data may be respectively mapped to the erase state E and the first to seventh program states P1 to P7.

Although the state data reordering operation has been described with reference to FIGS. 2A and 2B, the inventive concepts are not limited thereto. For example, the default order and the changed order may vary according to a data conversion algorithm of the memory controller 200 and a program algorithm of the memory device 100. Also, a state data reordering operation may be performed on not only the 2-bit data and 3-bit data but also data values of state data of 4 bits or more.

FIG. 3 is a block diagram of a memory device 100 according to some example embodiments.

Referring to FIG. 3, the memory device 100 may include a memory cell array 110, a page buffer circuit 120, a row decoder 140, a pass/fail check circuit (PFC) 150, a data I/O circuit 160, a voltage generator 170, and a control logic 180. The control logic 180 may include a reordering control circuit 130.

The memory cell array 110 may include a plurality of memory cells and be connected to word lines WL, string selection lines SSL, ground selection lines GSL, and bit lines BL. For example, the memory cell array 110 may be connected to the row decoder 140 through the word lines WL, the string selection lines SSL, and the ground selection lines GSL and be connected to the page buffer circuit 120 through the bit lines BL.

The memory cell array 110 may include a plurality of memory blocks BLK1 to BLKz (here, z is an integer larger than 2). Each of the memory blocks BLK1 to BLKz may have a 2D structure and/or a 3D structure (or a vertical structure). The memory blocks BLK1 to BLKz may be selected by the row decoder 140. For example, the row decoder 140 may select a memory block corresponding to a block address, from among the memory blocks BLK1 to BLKz. At least one memory block of the memory blocks BLK1 to BLKz may include a plurality of cell strings configured to share a bit line with each other.

The memory cell array 110 may include at least one of a single-level cell block including single-level cells, a multi-level cell block including multi-level cells, a triple-level cell block including triple-level cells, and a quadruple-level cell block including quadruple-level cells. In some example embodiments, some of the plurality of memory blocks BLK1 to BLKz included in the memory cell array 110 may be single-level cell blocks, and other memory blocks may be multi-level cell blocks, triple-level cell blocks, or quadruple-level cell blocks.

The page buffer circuit 120 may be connected to the memory cell array 110 through the bit lines BL and connected to the data I/O circuit 160 through data lines DL. The page buffer circuit 120 may operate in response to the control of the control logic 180. The page buffer circuit 120 may operate as a write driver or a sense amplifier according to an operation mode. For example, during a write operation, the page buffer circuit 120 may program data DATA, which is received from the data I/O circuit 160, to the memory cell array 110 and perform a verification read operation to verify whether a program operation has been passed or failed. In addition, during a read operation, the page buffer circuit 120 may verify data DATA from the memory cell array 110 and output the verified data DATA to the data I/O circuit 160.

In some embodiments, the page buffer circuit 120 may perform a state data reordering operation simultaneously with the program operation. The page buffer circuit 120 may perform the state data reordering operation in response to a reordering control signal RCS provided by the control logic 180. The page buffer circuit 120 may change a first state data order (e.g., a default order) into a second state data order (e.g., a final order).

During the read operation, the page buffer circuit 120 may perform the read operation based on a state data order to be changed, that is, the first state data order.

The row decoder 140 may select some word lines out of the word lines WL in response to a row address X-ADDR received from the control logic 180. For example, during the read operation, the row decoder 140 may apply a read voltage to the selected word lines and apply a read pass voltage (or a read inhibition voltage) to unselected word lines. Also, during the program operation, the row decoder 140 may apply a program voltage and a verification voltage (or a verification read voltage) to the selected word lines and apply a program pass voltage (or a program inhibition voltage) to the unselected word lines. In addition, the row decoder 140 may select some string selection lines of the string selection lines SSL or some ground selection lines of the ground selection lines GSL in response to the row address X-ADDR received from the control logic 180.

The PFC 150 may output a pass signal or a failure signal to the control logic 180 based on a verification read result collected by the page buffer circuit 120.

The data I/O circuit 160 may be connected to the page buffer circuit 120 through the data lines DL. The data I/O circuit 160 may operate via the control of the control logic 180. The data I/O circuit 160 may exchange data DATA with the outside (e.g., the memory controller 200 of FIG. 1). The data I/O circuit 160 may transmit data DATA, which is received from the outside, to the page buffer circuit 120 and output data, which is received from the page buffer circuit 120, to the outside.

The voltage generator 170 may generate various kinds of voltages for performing a program operation, a verification operation, and an erase operation on the memory cell array 110, based on a voltage control signal CTRL_vol received from the control logic 180. For example, the voltage generator 170 may generate a word line voltage, for example, a program voltage, a read voltage, a program pass voltage, a read pass voltage, an erase verification voltage, and/or a program verification voltage. Also, the voltage generator 170 may generate a string selection line voltage and a ground selection line voltage based on the voltage control signal CTRL_vol.

The control logic 180 may output various control signals for writing data DATA to the memory cell array 110 and/or verifying data DATA from the memory cell array 110 based on a command CMD, an address ADDR, and a control signal CTRL, which are received from the memory controller 200. Thus, the control logic 180 may generally control various operations of the memory device 100.

The various output signals output by the control logic 180 may be provided to the voltage generator 170, the row decoder 140, the page buffer circuit 120, and the data I/O circuit 160.

The control logic 180 may control a program operation and a verification read operation of the page buffer circuit 120 during a program operation and control a read operation of the page buffer circuit 120 during a read operation. The control logic 180 may include the reordering control circuit 130, and the reordering control circuit 130 may control the state data reordering operation of the page buffer circuit 120. The reordering control circuit 130 may provide a reordering control signal RCS for controlling the page buffer circuit 120 to change a state data order (i.e., to perform the state data reordering operation), to the page buffer circuit 120. The reordering control circuit 130 may generate the reordering control signal RCS based on a reordering sequence that is set to change the first state data order into the second state data order.

During the program operation, the page buffer circuit 120 may change stored state data (i.e., state data stored therein to correspond to each of the memory cells) in response to the reordering control signal RCS. Operations of the reordering control circuit 130 and the page buffer circuit 120 for the state data reordering operation will be described in detail below with reference to FIGS. 4 to 15.

During the read operation, the control logic 180 may control the page buffer circuit 120 to perform the read operation based on a state data order to be changed, that is, the first state data order.

As described above, according to the memory device 100 and the method of operating the same, the page buffer circuit 120 may perform the state data reordering operation so that a time required for the program operation can be reduced. Also, the state data reordering operation may be performed as a background operation simultaneously with the program operation, thereby improving the program performance of the memory device 100.

Figure 4:
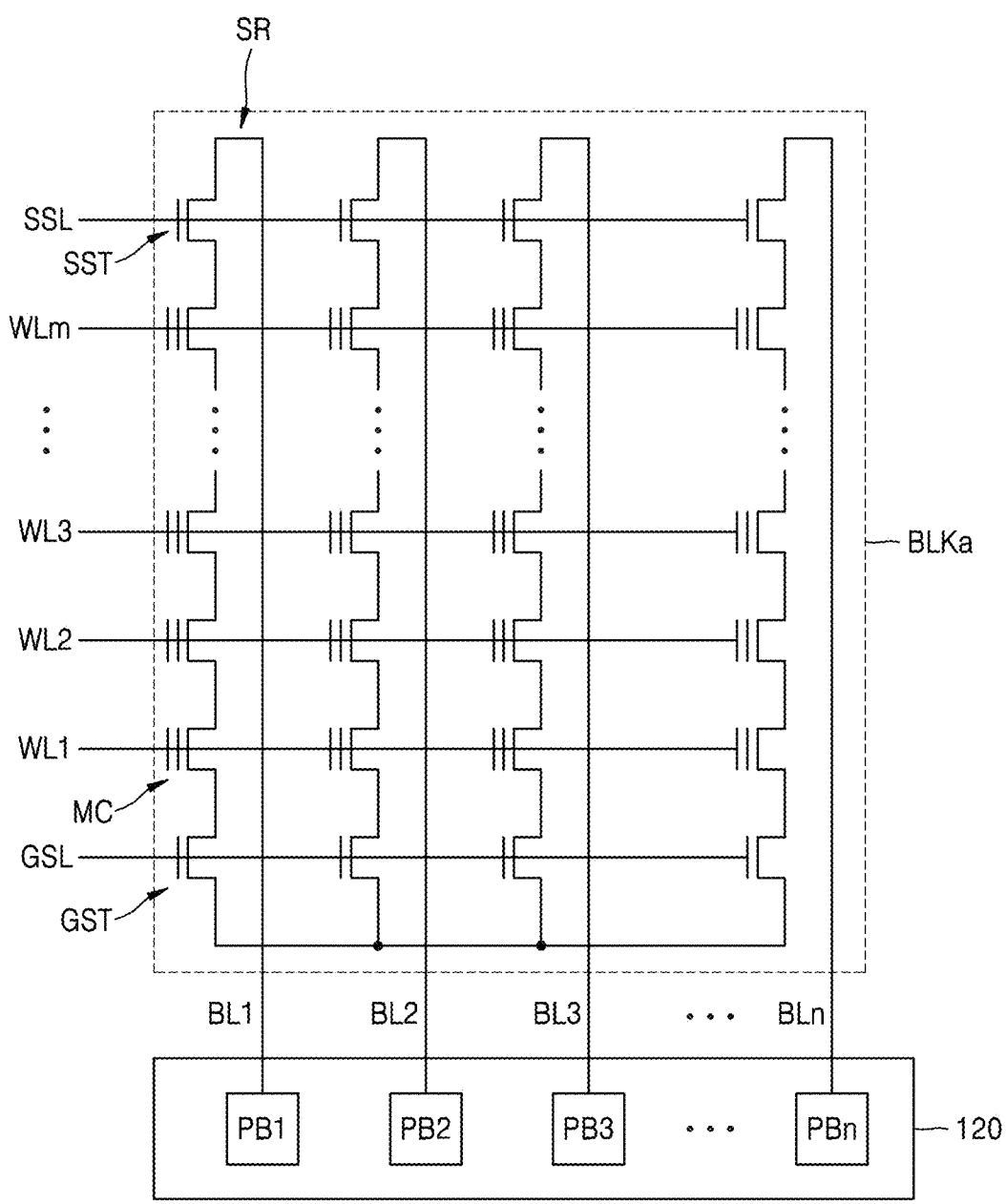
FIG. 4 is a circuit diagram showing the connection of one of memory blocks of FIG. 3 to a page buffer circuit, according to some example embodiments.

FIG. 4 is a circuit diagram showing the connection of one of the memory blocks BLK1 to BLKz of FIG. 3 to the page buffer circuit 120, according to some example embodiments.

Referring to FIG. 4, a memory block BLKa may include a plurality of strings SR. The plurality of strings SR may be respectively connected to a plurality of bit lines BL1 to BLn (here, n is an integer greater than 3). Each of the strings SR may include a ground selection transistor GST, memory cells MC, and a string selection transistor SST. Alternatively, although not shown, when the memory cell array 110 has a 3D structure, each of the bit lines BL1 to BLn may be connected to a plurality of strings SR connected to different string selection lines SSL.

The ground selection transistor GST of each of the strings ST may be connected between the memory cells MC and a common source line CSL. Ground selection transistors GST of the plurality of strings SR may be connected in common to the common source line CSL. The string selection transistor SST of each of the strings SR may be connected between the memory cells MC and the bit line BL. String selection transistors SST of the plurality of strings SR may be respectively connected to the plurality of bit lines BL1 to BLn. In each of the strings SR, a plurality of memory cells MC may be provided between the ground selection transistor GST and the string selection transistor SST. In each of the strings SR, the plurality of memory cells MC may be connected in series.

In a plurality of strings SR, memory cells MC located in the same order from the common source line CSL may be connected in common to one word line. The memory cells MC of the plurality of strings SR may be connected to a plurality of word lines WL1 to WLm.

A program operation and a read operation on the memory cells MC may be performed in units of word lines. Memory cells MC connected in common to one word line may be simultaneously programmed or simultaneously read. The memory cells MC that are simultaneously programmed or simultaneously read may be referred to as a physical page. When the memory cell MC stores data of 2 bits or more, the physical page may include a plurality of logical pages. For example, in FIG. 2A, an LSB of data corresponding to the memory cells MC may comprise a first logical page, and an MSB of data corresponding to the memory cells MC may comprise a second logical page.

An erase operation on the memory cells MC may be performed in units of memory blocks. Memory cells MC of one memory block BLKa may be simultaneously erased. In some example embodiments, the erase operation on the memory cells MC may be performed in units of sub-blocks. One memory block BLKa may be divided into a plurality of sub-blocks, and memory cells MC of one sub-block may be simultaneously erased.

The page buffer circuit 120 may include a plurality of page buffers PB1 to PBn. The page buffers PB1 to PBn may be connected to the bit lines BL1 to BLn, respectively. The page buffer circuit 120 may temporarily store data DATA, which is verified by the memory cell array 110, or temporarily store data DATA, which is to be written to the memory cell array 110. For example, each of the page buffers PB1 to PBn may include a plurality of latches. The latches may temporarily store the data DATA.

Figure 5:
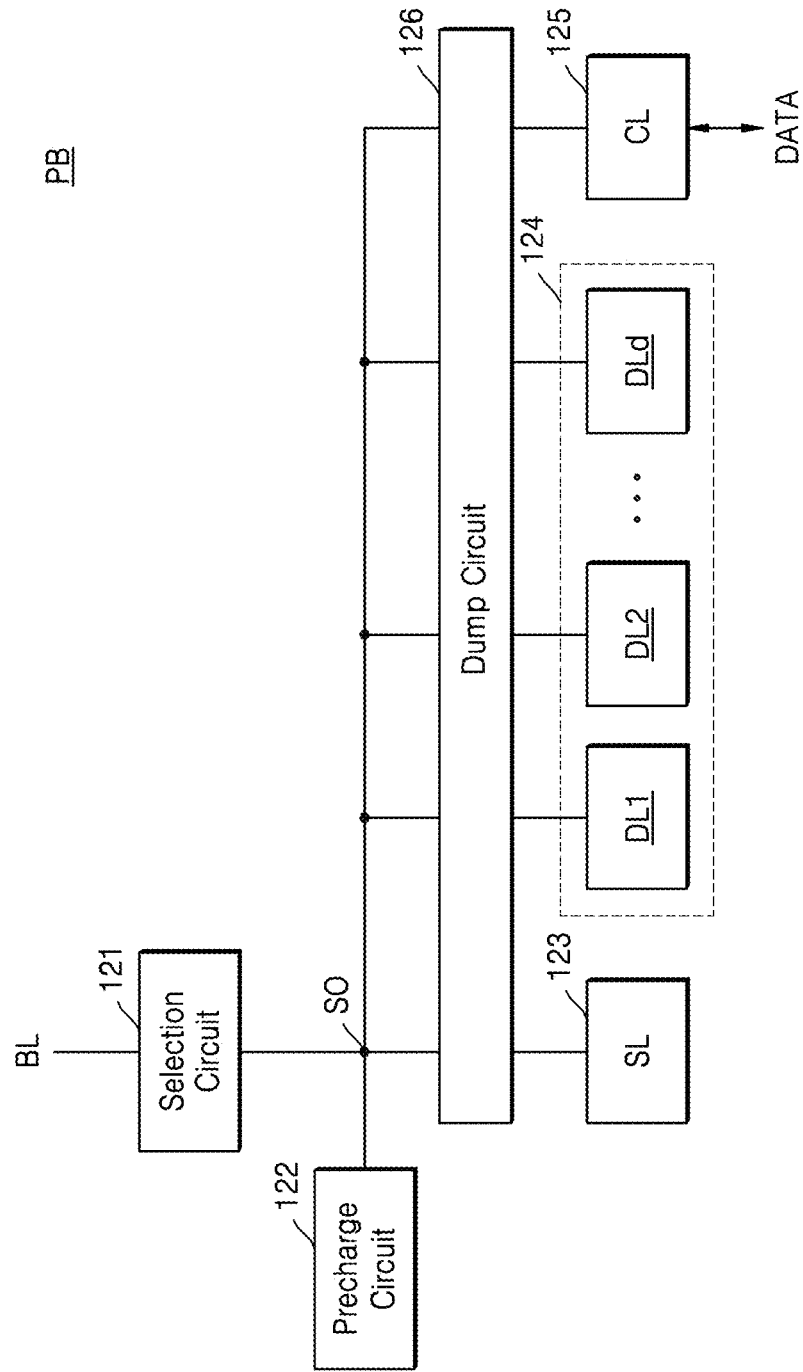
FIG. 5 is a diagram of a page buffer shown in FIG. 4, according to some example embodiments.

FIG. 5 is a diagram of a page buffer shown in FIG. 4, according to some example embodiments.

Referring to FIG. 5, a page buffer PB may include a selection circuit 121, a precharge circuit 122, a sense latch 123, a data latch unit 124 including a plurality of data latches DL1 to DLd (here, d is an integer equal to or larger than 2), a cache latch 125, and a dump circuit 126.

The selection circuit 121 may be connected between a bit line SL and a sensing node SO and connect the bit line SL to the sensing node SO in response to a received selection control signal. For example, the selection circuit 121 may be implemented as at least one transistor configured to be turned on or turned off in response to the selection control signal.

The precharge circuit 122 may precharge a selected bit line BL during a program operation (e.g., a program voltage application operation and a verification read operation) and a verification operation.

The sense latch 123 may sense a voltage of the sensing node SO after a sensing operation, and latch a sensed to and store programmed data in a memory cell MC connected to the bit line BL.

During the program operation, the plurality of data latches DL1 to DLd included in the data latch unit 124 may store state data indicating a state to which the memory cell MC is to be programmed. For example, when the memory cell MC is programmed with 2-bit data, the plurality of data latches DL1 to DLd may be two data latches DL1 and DL2, and 2-bit state data may be loaded in the two data latches DL1 and DL2. When the memory cell MC is programmed with 3-bit data, the plurality of data latches DL1 to DLd may be three data latches DL1 to DL3, and 3-bit state data may be loaded in the three data latches DL1 to DL3. However, the inventive concepts are not limited thereto, and the data latch unit 124 may further include at least one data latch for backup.

The cache latch 125 may receive and load data DATA from the data I/O circuit (refer to 16 in FIG. 3) on a bit basis and transmit the received data DATA to the plurality of data latches DL1 to DLd due to a data dump operation.

The sense latch 123, the plurality of data latches DL1 to DLd, and the cache latch 125 may be connected to the sensing node NO through the dump circuit 126. The dump circuit 126 may set or reset at least one of the plurality of data latches DL1 to DLd based on bits stored in the cache latch 125. Thus, the data DATA loaded in the cache latch 125 may be transmitted to the plurality of data latches DL1 to DLd. The dump circuit 126 may set or reset the sense latch 123 based on bits loaded in the plurality of data latches DL1 to DLd or set or reset at least one of the plurality of data latches DL1 to DLd based on the bits loaded in the sense latch 123. In addition, the dump circuit 126 may set or reset at least one different latch based on at least one bit loaded in at least one of the plurality of data latches DL1 to DLd. A dump operation (or a data bump operation) may be performed depending on a set or reset operation on the plurality of data latches DL1 to DLd, the sense latch 123, and the cache latch 125.

During the state data reordering operation, the dump circuit 126 may perform a dump operation on the plurality of data latches DL1 to DLd in response to a reordering control signal (refer to RCS in FIG. 3). The state data reordering operation may include a plurality of dump operations. Due to the dump operation on the plurality of data latches DL1 to DLd, bits loaded in at least one of the plurality of data latches DL1 to DLd may be changed (e.g., changed from '0' to '1' or from '1' to '0'). Accordingly, data values of the state data may be changed.

Figure 6A:
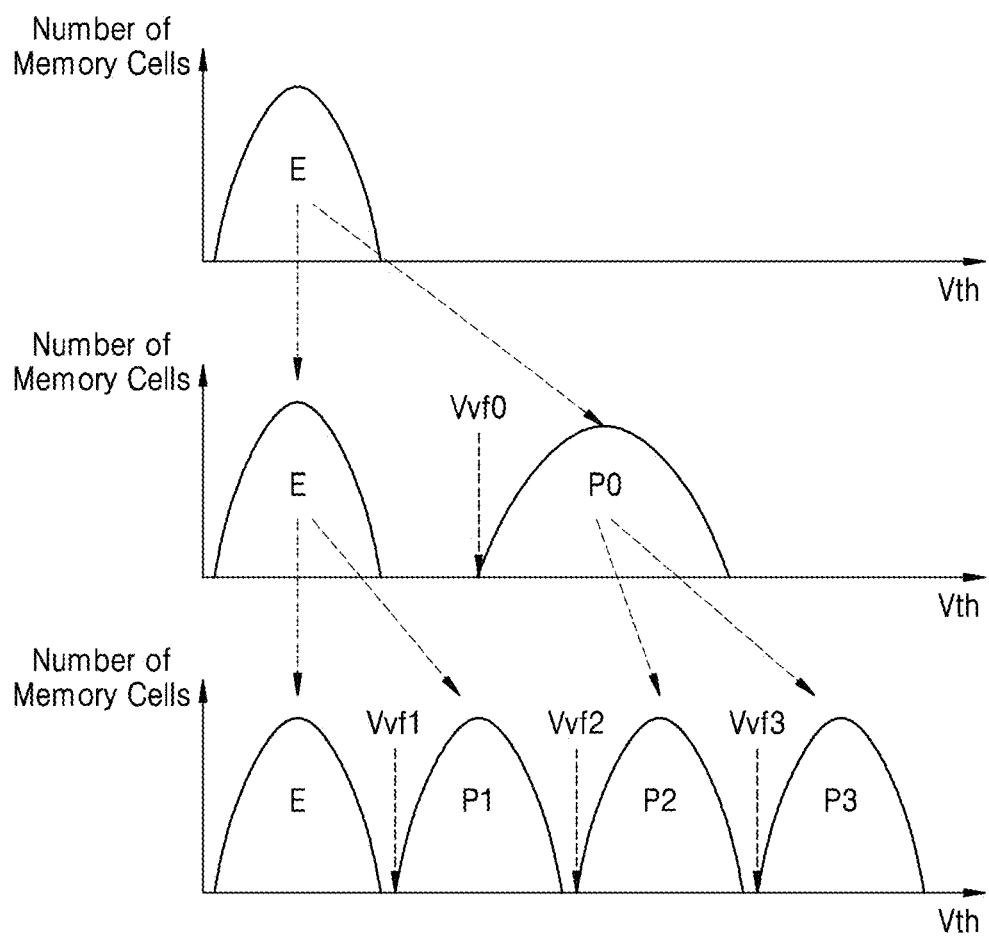
FIGS. 6A and 6B illustrate sequences in which a plurality of states are formed according to a program algorithm of a memory device according to some example embodiments.
Figure 6B:
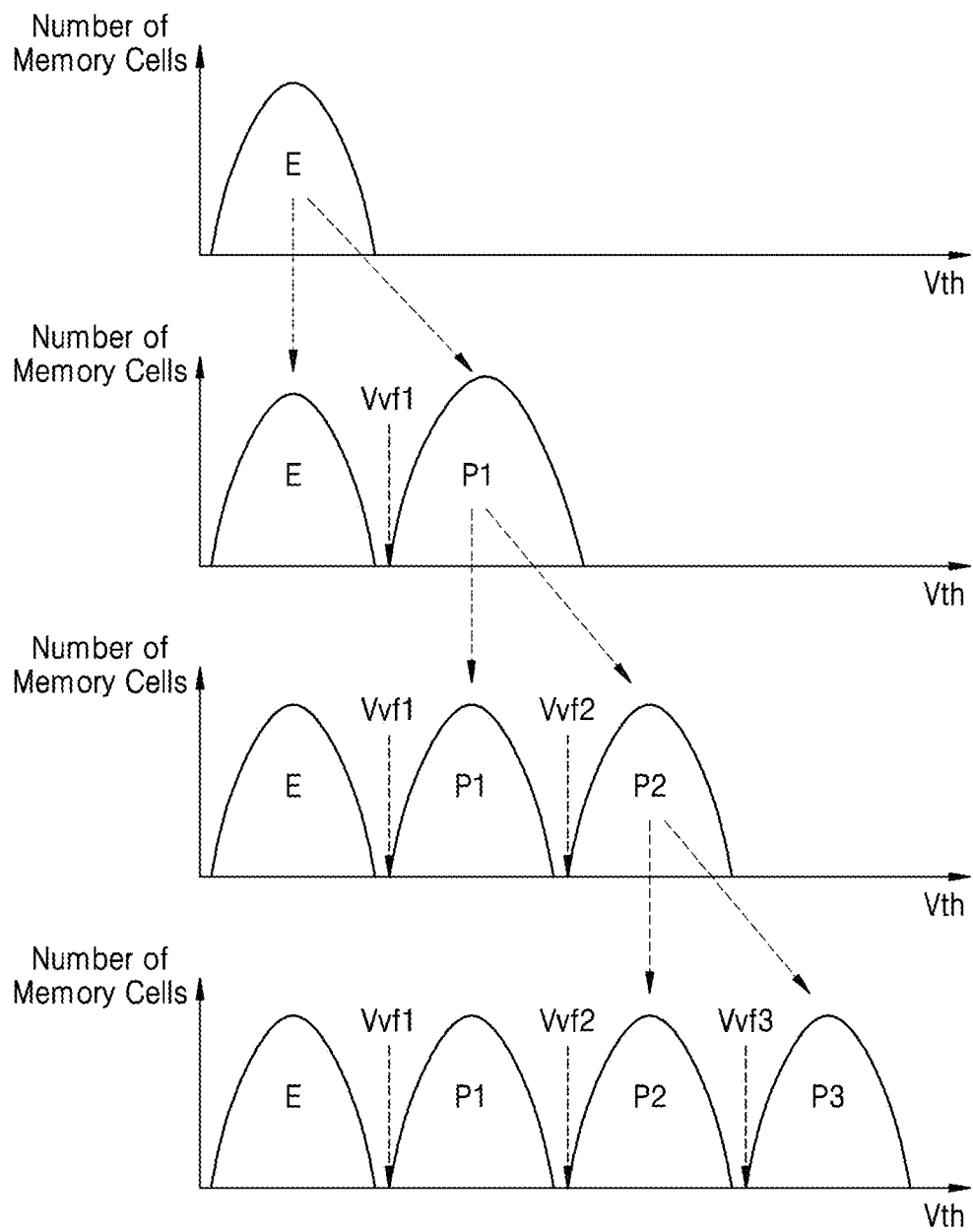

FIGS. 6A and 6B illustrate sequences in which a plurality of states are formed according to a program algorithm of a memory device according to some example embodiments.

Referring to FIGS. 6A and 6B, memory cells in an erase state E may be programmed to the erase state E and first to third program states P1 to P3. In some example embodiments, the memory cells may be programmed in various sequences according to a program algorithm.

For instance, as shown in FIG. 6A, some of the memory cells in the erase state E may be programmed to an initial program state P0. A verification read operation of verifying whether a program operation in the initial program state P0 has been passed or failed may be performed based on an initial verification voltage Vvf0.

Thereafter, some of the remaining memory cells in the erase state E may be programmed to the first program state P1, some of the memory cells in the initial program state P0 may be programmed to the second program state P2, and some of the remaining memory cells in the initial program state P0 may be programmed to the third program state P3. Verification read operations of verifying whether program operations in the first program state P1, the second program state P2, and the third program state P3 have been passed or failed may be performed based on first, second, and third verification voltages Vvf1, Vvf2, and Vvf3.

In some example embodiments, as shown in FIG. 6B, the remaining memory cells, except for memory cells set to be programmed to the erase state E (i.e., memory cells to be maintained in the erase state E), from among the memory cells in the erase state E, may be programmed to the first program state P1, and a verification read operation may be performed based on the first verification voltage Vvf1.

Thereafter, memory cells (i.e., memory cells set to be programmed to the second program state P2 and the third program state P3), except for memory cells set to be programmed to the erase state E and the first program state P1, may be programmed to the second program state P2, and a verification read operation may be performed based on the second verification voltage Vvf2. Finally, memory cells set to be programmed to the third program state P3 may be programmed to the third program state P3.

As described with reference to FIGS. 6A and 6B, memory cells may be respectively programmed to a plurality of program states (e.g., the first to third program states P1 to P3) via an intermediate state (e.g., the initial program state P0) or programmed to the first to third program states P1 to P3 by stages according to a program algorithm. As described above, a sequence (or process) in which a plurality of states (an erase state and a plurality of program states) are formed may be different according to various program algorithms.

Figure 7A:
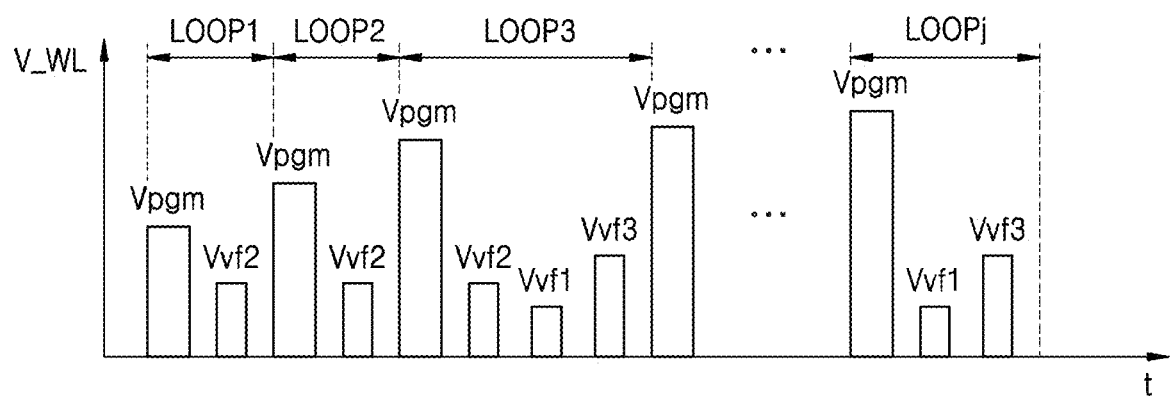
FIGS. 7A and 7B are timing diagrams of sequences in which a program operation is performed according to a program algorithm of a memory device according to some example embodiments.
Figure 7B:
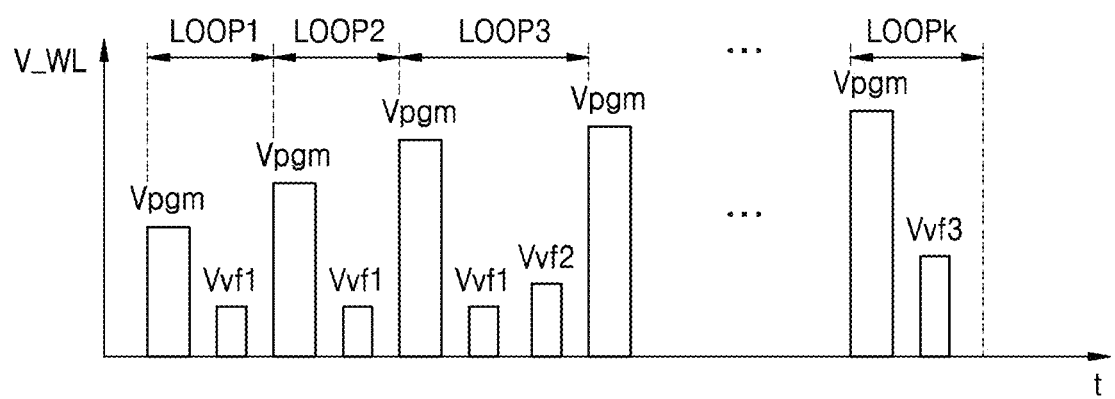

FIGS. 7A and 7B are timing diagrams of sequences in which a program operation is performed according to a program algorithm of a memory device according to some example embodiments. In FIGS. 7A and 7B, the abscissa denotes time and the ordinate denotes a voltage level applied to a selected word line connected to selected memory cells.

Referring to FIG. 7A, a program operation may include a plurality of program loops LOOP1 to LOOPj (here, j is an integer greater than 3). In each of the plurality of program loops LOOP1 to LOOPj, a program voltage Vpgm (or referred to as a program pulse) may be applied to a word line and at least one of a plurality of verification voltages (e.g., Vvf1, Vvf2, and Vvf3) may be subsequently applied. A level of the second verification voltage Vvf2 may be higher than a level of the first verification voltage Vvf1, and a level of the third verification voltage Vvf3 may be higher than the level of the second verification voltage Vvf2. After the program voltage Vpgm, a program recovery operation in which a ground voltage is applied to the word line may be performed before a verification voltage is applied. According to an incremental step pulse programming (ISPP) method, a level of the program voltage Vpgm applied in the plurality of program loops LOOP1 to LOOPj may be increased.

In a first program loop LOOP1 and a second program loop LOOP2, after the program voltage Vpgm is applied, the second verification voltage Vvf2 may be applied. In a third program loop LOOP3, after the program voltage Vpgm is applied, the second verification voltage Vvf2, the first verification voltage Vvf1, and the third verification voltage Vvf3 may be sequentially applied. In a final program loop LOOPj, after the program voltage Vpgm is applied, the first verification voltage Vvf1 and the third verification voltage Vvf3 may be sequentially applied.

Referring to FIG. 7B, a program operation may include a plurality of program loops LOOP1 to LOOPk (here, k is an integer greater than 3). Unlike shown in FIG. 7A, in FIG. 7B, in a first program loop LOOP1 and a second program loop LOOP2, after a program voltage Vpgm is applied, a first verification voltage Vvf1 may be applied. In a third program loop LOOP3, after the program voltage Vpgm is applied, the first verification voltage Vvf1 and a second verification voltage Vvf2 may be sequentially applied. In a final program loop LOOPj, after the program voltage Vpgm is applied, a third verification voltage Vvf3 may be applied.

As described with reference to FIGS. 7A and 7B, a verification sequence may vary according to a program algorithm during a program operation.

As described with reference to FIGS. 6A to 7B, a program method (e.g., an order in which program states are formed and a verification order) may vary according to a set program algorithm, and the number of dump operations of the page buffer circuit (refer to 120 in FIG. 3) and a time required for the program operation may vary according to the program method.

For example, a time required to perform a program operation according to a first program algorithm and a first state data order may be different from a time required to perform a program operation according to the first program algorithm and a second state data order. Also, the time required to perform the program operation according to the first program algorithm and the first state data order may be different from a time required to perform a program operation according to a second program algorithm and the first state data order. The memory device (refer to 100 in FIGS. 1 and 3) according to some example embodiments may determine an optimized state data order, which may minimize a time required for a program operation according to a set program algorithm, and perform a state data reordering operation to change the state data order into the optimized state data order as described above.

Figure 8:
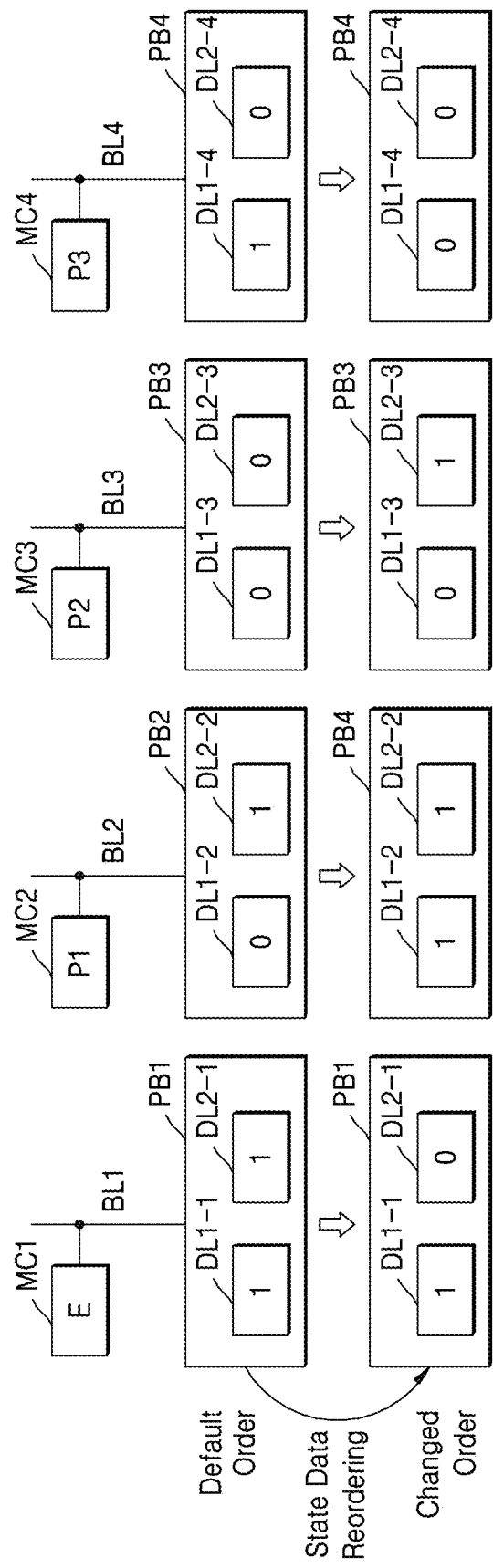
FIG. 8 illustrates a change in data value of state data loaded in a plurality of page buffers due to a state data reordering operation of a memory device according to some example embodiments.

FIG. 8 illustrates a change in data value of state data loaded in a plurality of page buffers due to a state data reordering operation of a memory device according to some example embodiments. First to fourth page buffers PB1 to PB4 and first to fourth memory cells MC1 to MC4 are illustrated for brevity. The first to fourth memory cells MC1 to MC4 may be respectively connected to corresponding ones of the first to fourth page buffers PB1 to PB4 through first to fourth bit lines LB1 to LB4, respectively. FIG. 8 illustrates one example embodiment, for example, in which the first to fourth page buffers PB1 to PB4 include pairs of data latches DL1-1 and DL2-1, DL1-2 and DL2-2, DL1-3 and DL2-3, and DL1-4 and DL2-4, respectively.

Before the state data reordering operation is performed, '1' may be loaded in each of a first data latch DL1-1 and a second data latch DL2-1 of the first page buffer PB1. Accordingly, a data value of state data stored in the first page buffer PB1 may be '11.' A data value of state data stored in the second page buffer PB2 may be '01,' a data value of state data stored in the third page buffer PB3 may be '00,' and a data value of state data stored in the fourth page buffer PB4 may be '10.' The first to fourth memory cells MC1 to MC4 may be respectively set to be programmed to an erase state E and first to third program states P1 to P3 according to a default order (e.g., the default order of FIG. 2A). In other words, target states of the first to fourth memory cells MC1 to MC4 may be set to the erase state E and the first to third program states P1 to P3, respectively.

During a program operation, the first to fourth page buffers PB1 to PB4 may simultaneously perform the state data reordering operation. Data values of state data of the first to fourth page buffers PB1 to PB4 may be changed in a state data order that is optimized according to a program algorithm, that is, a changed state data order (e.g., the changed order of FIG. 2A).

The data value of the state data may be changed due to a plurality of dump operations of the data latches included in each of the first to fourth page buffers PB1 to PB4. The data value of the state data stored in the first page buffer PB1 may be changed into '10,' the data value of the state data stored in the second page buffer PB2 may be changed into '11,' the data value of the state data stored in the third page buffer PB3 may be changed into '01,' and the data value of the state data stored in the fourth page buffer PB4 may be changed into '00.' After the state data reordering operation is performed, a program operation may be performed based on the changed state data order.

Figure 9:
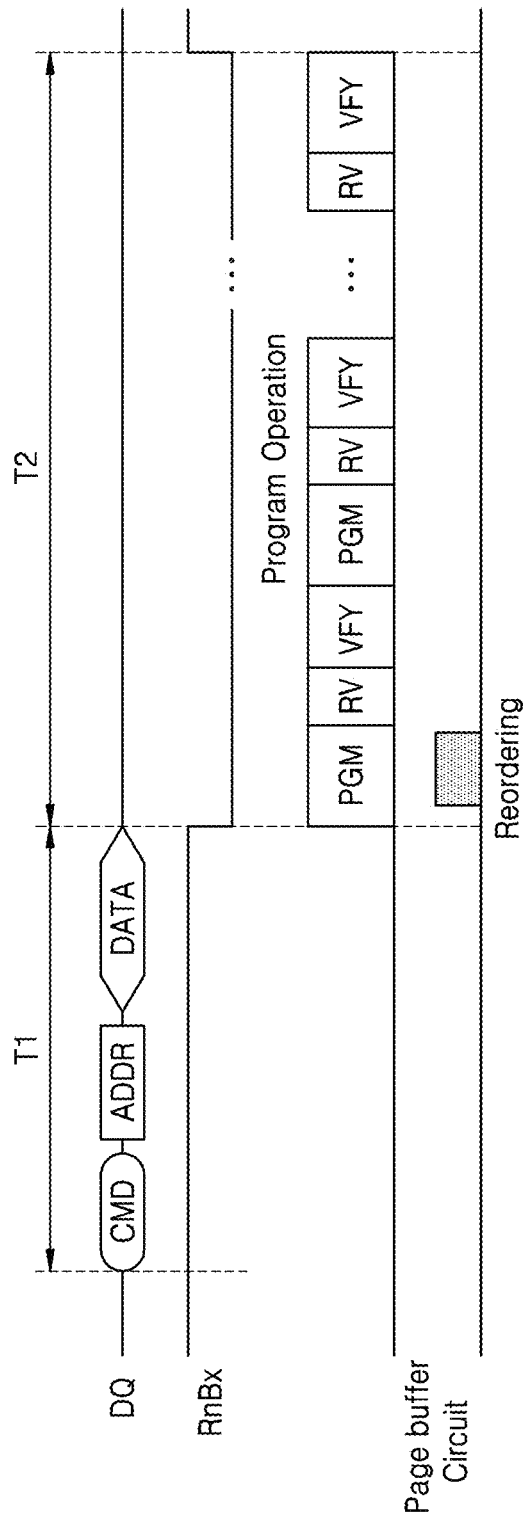
FIG. 9 is a timing diagram of an operation of a memory device according to some example embodiments.

FIG. 9 is a timing diagram of an operation of a memory device according to some example embodiments. The operation of FIG. 9 may be performed by the memory device 100 of FIGS. 1 and 3.

Referring to FIG. 9, the memory device 100 may transmit a ready-busy signal RnBx to the memory controller 200 and receive a command CMD, an address ADDR, and data DATA from the memory controller 200 through an I/O channel DQ when the ready-busy signal RnBx is at a first level (e.g., a logic high level). The memory device 100 may receive the command CMD, the address ADDR, and the data DATA in a first period T1.

The memory device 100 may set the ready-busy signal RnBx to a second level (e.g., a logic low level) and perform a program operation on a memory cell array in a second period T2.

A period in which a program operation is performed (hereinafter, referred to as a program period), that is, the second period T2, may include a plurality of sub-periods. For example, the plurality of sub-periods may include a plurality of program voltage application periods PGM in which a program voltage and/or a program pulse is applied, a plurality of program recovery periods RV in which a program recovery operation is performed, and a plurality of verification periods VFY in which a verification read operation is performed. The reordering control circuit 130 may select at least one period out of the plurality of sub-periods and control the page buffer circuit 120 to perform a state data reordering operation in the at least one selected sub-period. When the program operation is performed, for example, when the program pulse is applied, when the program recovery operation is performed, and/or when the verification read operation is performed, the page buffer circuit 120 may perform a state data reordering operation as a background operation simultaneously with the above-described operations.

In some example embodiments, the page buffer circuit 120 may control the page buffer circuit 120 to perform the state data reordering operation in a period in which an initial program voltage is applied to the memory cell array (e.g., a selected word line).

Figure 10A:
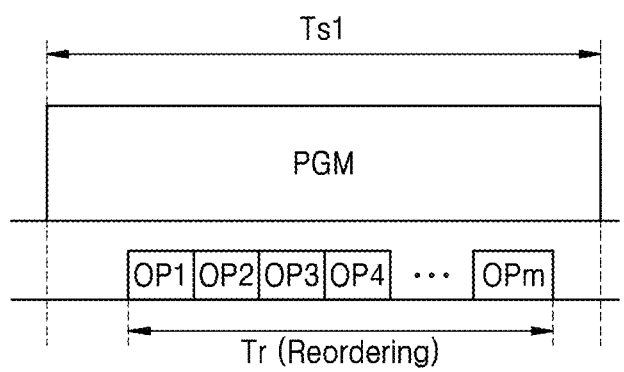
FIGS. 10A and 10B illustrate relationships between times taken for a state data reordering operation and a time during which a specific period selected out of a plurality of sub-periods included in a program period is performed, according to some example embodiments.
Figure 10B:
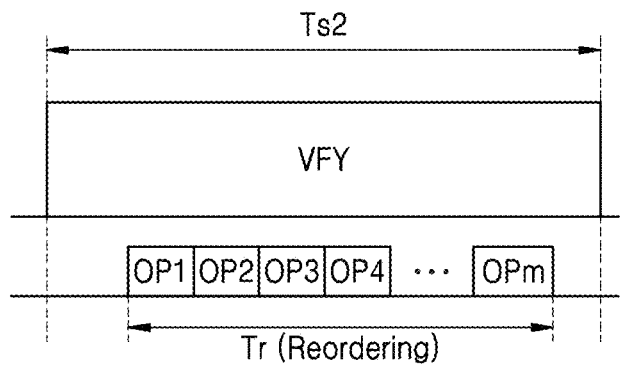

FIGS. 10A and 10B illustrate relationships between times required for a state data reordering operation and a time during which a specific period selected out of a plurality of sub-periods included in a program period is performed, according to some example embodiments.

Referring to FIG. 10A, the state data reordering operation may include a plurality of operations OP1 to OPm (here, m is an integer equal to or more than 4). For example, when state data is 2-bit data, the state data reordering may include several operations. When the state data is 3-bit data, the state data reordering may include dozens of operations. When the state data reordering operation is performed in a program voltage application period PGM, the state data reordering operation may be performed simultaneously with the application of a program voltage. A time (hereinafter, referred to as a reordering time) Tr required for the state data reordering operation may be shorter than or equal to a time Ts1 corresponding to the program voltage application period PGM.

Referring to FIG. 10B, the state data reordering operation may be performed simultaneously with a verification read operation in a verification period VFY. A reordering time Tr may be shorter than or equal to a time Ts2 corresponding to the verification period VFY.

Figure 11A:
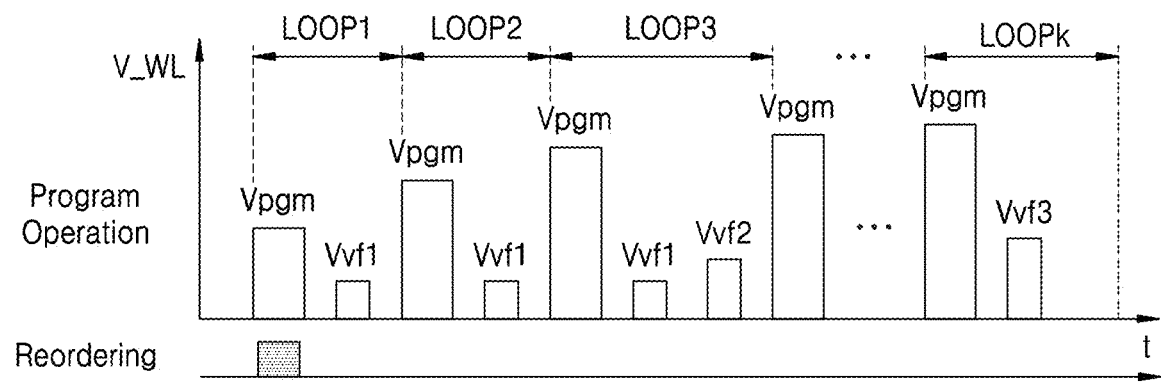
FIGS. 11A, 11B, and 11C illustrate periods in which a state data reordering operation is performed in a memory device according to some example embodiments.
Figure 11B:
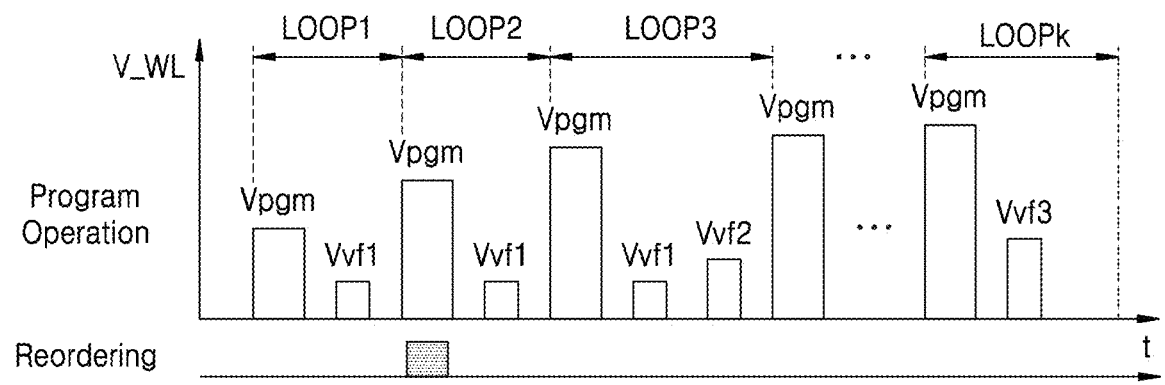
Figure 11C:
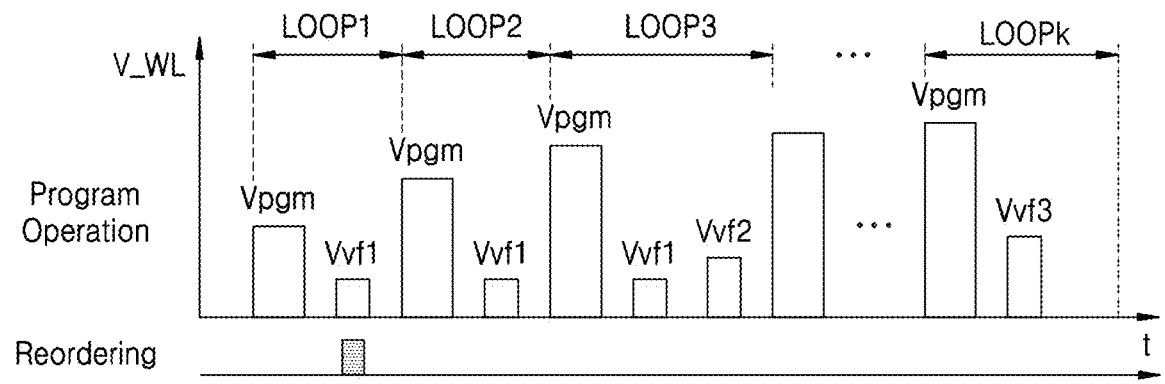

FIGS. 11A, 11B, and 11C illustrate periods in which a state data reordering operation is performed in a memory device according to some example embodiments.

Referring to FIGS. 11A to 11C, the state data reordering operation may be performed in one sub-period selected out of a plurality of sub-periods included in a program period.

Referring to FIG. 11A, the state data reordering may be performed in a period to which a program voltage Vpgm is firstly applied, that is, a program voltage application period of a first program loop LOOP1. Referring to FIG. 11B, the state data reordering operation may be performed in a period to which the program voltage Vpgm is secondly applied, that is, in a program voltage application period of a second program loop LOOP2. As described with reference to FIGS. 11A and 11B, the state data reordering operation may be performed in one period of a plurality of program voltage application periods to which the program voltage Vpgm is applied. In some example embodiments, a reordering time may be shorter than or equal to a time required to apply the program voltage Vpgm.

Referring to FIG. 11C, the state data reordering operation may be performed in a period in which a verification read operation is performed. That is, the state data reordering operation may be performed simultaneously with the verification read operation. In some example embodiments, the reordering time may be shorter than or equal to a time required to apply a verification voltage, for example, a time required to apply a first verification voltage Vvf1.

Figure 12:
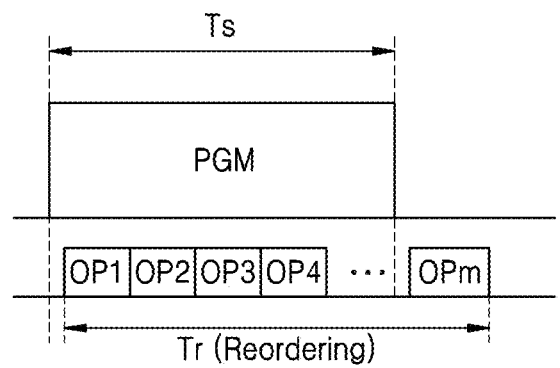
FIG. 12 illustrates a relationship between a time taken for a state data reordering operation and a time during which a specific sub-period selected out of a plurality of sub-periods included in a program period is performed, according to some example embodiments.

FIG. 12 illustrates a relationship between a time required for a state data reordering operation and a time during which a specific period selected out of a plurality of sub-periods included in a program period is performed, according to some example embodiments.

Referring to FIG. 12, a reordering time Tr may be performed in a sub-period (e.g., a program voltage application period PGM) selected out of a plurality of sub-periods included in a program period. The reordering time Tr may be longer than a time Ts required for the selected sub-period.

As shown in FIG. 12, when the reordering time Tr is longer than the time Ts required for the selected sub-period, a state data reordering operation may be separated into a plurality of sequences, and the plurality of sequences may be respectively performed in selected sub-periods of the plurality of sub-periods included in the program period.

The reordering control circuit (refer to 130 in FIGS. 1 and 3) may compare the reordering time Tr with the time Ts required for the selected sub-period and divide (or separate) the state data reordering operation into the plurality of sequences when the reordering time Tr is longer than the time Ts required for the selected sub-period. The reordering control circuit 130 may select a plurality of sub-periods in which the plurality of sequences are to be performed simultaneously with a corresponding program operation, from among the plurality of sub-periods included in the program period. For example, the reordering control circuit 130 may select an already selected sub-period again and further select another sub-period.

Figure 13A:
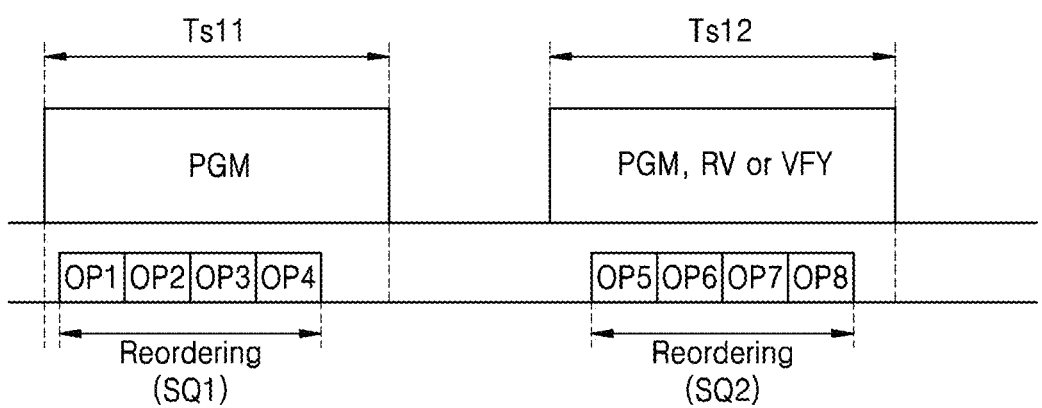
FIG. 13A illustrates a method of separating a state data reordering operation into a plurality of sequences in a memory device according to some example embodiments.
Figure 13B:
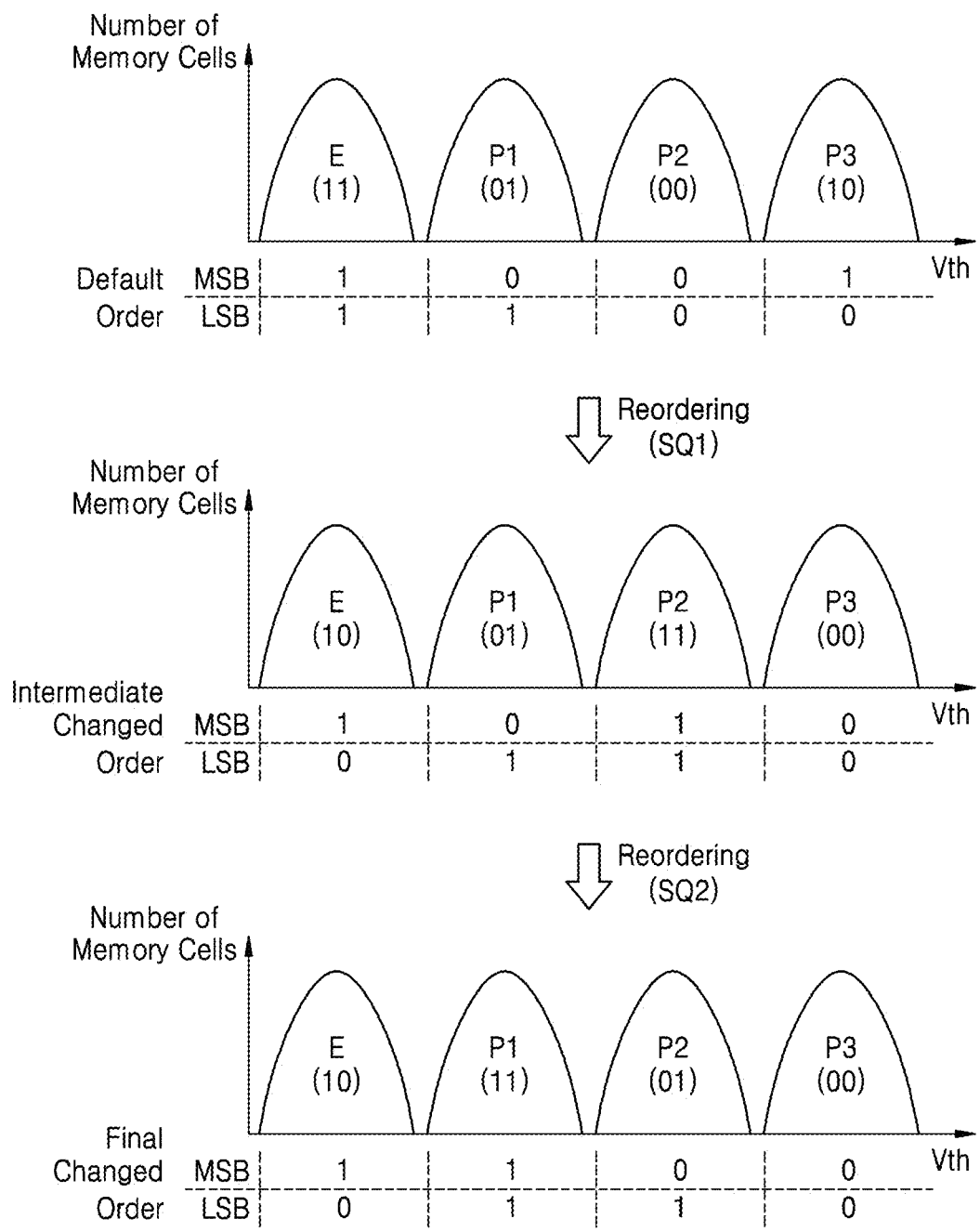
FIG. 13B illustrates a process of changing a state data order by performing a plurality of sequences in a memory device according to some example embodiments.

FIG. 13A illustrates a method of separating a state data reordering operation into a plurality of sequences in a memory device, according to some example embodiments. FIG. 13B illustrates a process of changing a state data order by performing a plurality of sequences in a memory device according to some example embodiments.

Referring to FIG. 13A, the state data reordering operation may include a plurality of operations, for example, first to eighth operations OP1 to OP8. Also, a time (i.e., a reordering time) required to perform all of the first to eighth operations OP1 to OP8 may be longer than a first time Ts11 assigned to a first sub-period (e.g., a program voltage application period PGM), which is selected out of a plurality of sub-periods of a program period.

The reordering control circuit (refer to 130 in FIGS. 1 and 3) may divide the first to eighth operations OP1 to OP8 of the state data reordering operation into a plurality of reordering sequences, for example, a first reordering sequence SQ1 and a second reordering sequence SQ2, and select sub-periods in which the plurality of reordering sequences are to be performed, out of the plurality of sub-periods of the program period.

For example, of the first to eighth operations OP1 to OP8, the reordering control circuit 130 may classify first to fourth operations OP1 to OP4 as a first reordering sequence SQ1 and classify fifth to eighth operations OP5 to OP8 as a second reordering sequence SQ2. The reordering control circuit 130 may select a selected first sub-period and at least one period of subsequent other second sub-periods (e.g., a program voltage application period PGM, a program recovery period RV, and a verification period VFY). The first reordering sequence SQ1 (i.e., a time during which the first to fourth operations OP1 to OP4 are performed) may be equal to or shorter than the first time Ts11 corresponding to the first sub-period. The second reordering sequence SQ2 (i.e., a time during which the fifth to eighth operations OP5 to OP8 are performed) may be equal to or shorter than the second time Ts12 corresponding to the second sub-period.

The reordering control circuit 130 may control the page buffer circuit (refer to 120 in FIGS. 1 and 3) to perform a plurality of reordering sequences (e.g., the first reordering sequence SQ1 and the second reordering sequence SQ2) in a plurality of selected sub-periods.

Referring to FIG. 13B, the state data reordering operation may be divided into a first reordering sequence SQ1 and a second reordering sequence SQ2. The first reordering sequence SQ1 may be performed in a first sub-period, which is a preceding sub-period of two sub-periods selected out of a plurality of sub-periods of a program period, so that a state data order may be reordered (changed) from a default order to an intermediately changed order. Subsequently, the second reordering sequence SQ2 may be performed in a second sub-period of the two selected sub-periods, so that the state data order may be reordered (changed) from the intermediately changed order to a finally changed order.

When the state data reordering operation is performed by stages, a program method may be changed. After the first reordering sequence SQ is performed, the memory device 100 may perform a program operation based on the intermediately changed order. Accordingly, the control logic (refer to 180 in FIG. 3) may change a program algorithm according to the intermediately changed order to change the program method and perform a program operation based on the intermediately changed order and the changed program method.

Figure 14A:
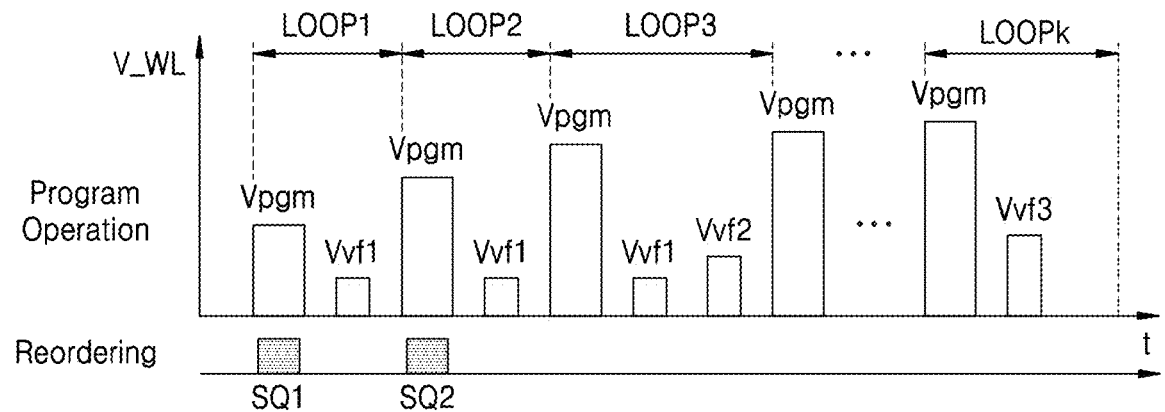
FIGS. 14A, 14B, and 14C illustrate periods in which a state data reordering operation is performed in a memory device according to some example embodiments.
Figure 14B:
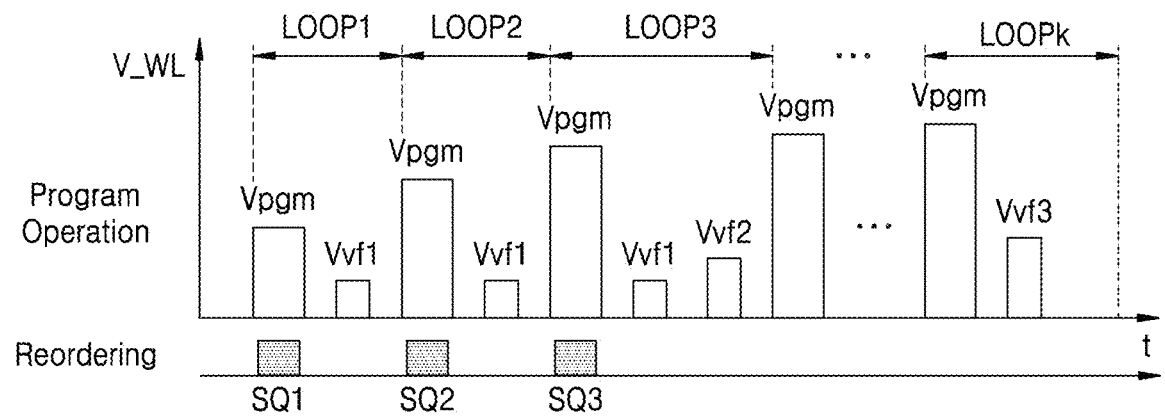
Figure 14C:
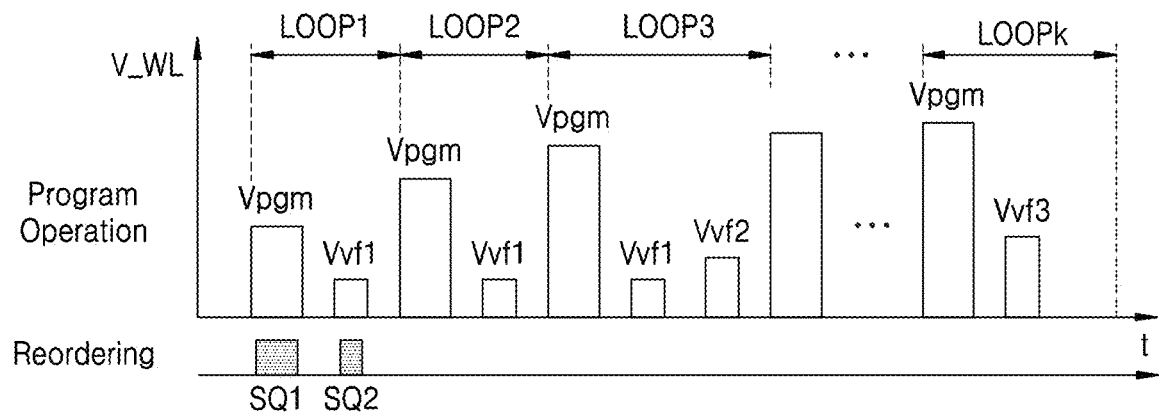

FIGS. 14A, 14B, and 14C illustrate periods in which a state data reordering operation is performed in a memory device according to some example embodiments.

Referring to FIGS. 14A, 14B, and 14C, the state data reordering operation may be divided into a plurality of reordering sequences, which may be respectively performed in sub-periods selected out of a plurality of sub-periods included in a program period.

Referring to FIG. 14A, the state data reordering operation may be divided into a first reordering sequence SQ1 and a second reordering sequence SQ2, which may be respectively performed in periods in which program voltages Vpgm of a first program loop LOOP1 and a second program loop LOOP2 are applied.

Referring to FIG. 14B, the state data reordering operation may be divided into a first reordering sequence SQ1, a second reordering sequence SQ2, and a third reordering sequence SQ3, which may be respectively performed in sub-periods in which program voltages Vpgm of a first program loop LOOP1, a second program loop LOOP2, and a third program loop LOOP3 are applied.

As described with reference to FIGS. 14A and 14B, the state data reordering operation may be performed by at least two of a plurality of program periods to which the program voltage Vpgm is applied. A reordering time may be longer than a unit time required to apply the program voltage Vpgm. Accordingly, the state data reordering operation may be divided into a plurality of sequences, which may be performed in at least two program application periods.

Referring to FIG. 14C, the state data reordering operation may be divided into first and second reordering sequences SQ1 and SQ2. The first reordering sequence SQ1 may be performed in a sub-period (i.e., a program voltage application period) in which a program voltage Vpgm of a first program loop LOOP1 is applied, and the second reordering sequence SQ2 may be performed in a sub-period (i.e., a verification period) in which a first verification voltage Vvf1 is applied. A reordering time may be longer than each of the program voltage application period and the verification period. Accordingly, the state data reordering operation may be divided into a plurality of sequences, which may be respectively performed in a program application period and a verification period.

Figure 15:
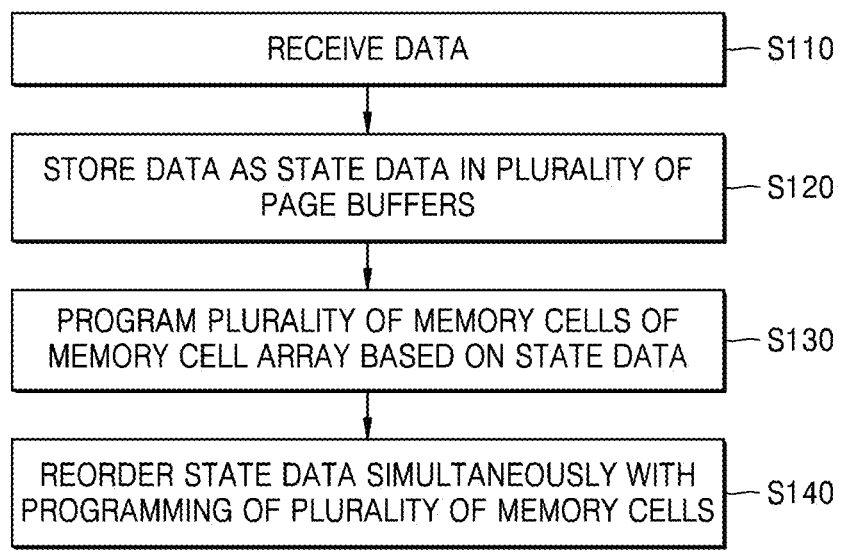
FIG. 15 is a flowchart of an operation of a memory device according to some example embodiments.

FIG. 15 is a flowchart of an operation of a memory device 100 according to some example embodiments. The operation of FIG. 15 may be performed by the memory device 100 of FIGS. 1 and 3. Accordingly, the above-described operation of the memory device 100 may be applied to example embodiments.

Referring to FIG. 15, the memory device 100 may receive data (S110). The memory device 100 may receive write data from the memory controller 200, and the write data may be data generated based on a first state data order.

The memory device 100 may store received data as state data in a plurality of page buffers (S120). For example, when a memory cell is programmed with 2-bit data, state data may be stored on a 2-bit basis in the plurality of page buffers.

The memory device 100 may program a plurality of memory cells of a memory cell array based on the state data (S130). A target state in which the memory cell is to be programmed may be set based on the first state data order and the state data, and the memory device 100 may program the memory cell to the target state.

The memory device 100 may perform a state data reordering operation simultaneously with a program operation (S140). When the program operation is performed, the memory device 100 may perform the state data reordering operation as a background operation. Due to the state data reordering operation, the first state data order may be changed into a second state data order. The second state data order may be a state data order that is set to reduce a program time based on a program algorithm set for the memory device 100. When the first state data order is changed into the second state data order due to the state data reordering operation, the memory device 100 may perform a subsequent program operation based on the second state data order. In other words, when data values of the state data stored in the plurality of page buffers are changed according to the second state data order, the program operation may be performed based on the changed data values.

As described with reference to FIGS. 1 to 14, the memory device 100 may select at least one sub-period out of a plurality of sub-periods included in a program period and perform a state data reordering operation in the at least one selected sub-period. When a time required for the state data reordering operation is longer than a length of one selected sub-period, the memory device 100 may divide the state data reordering operation into a plurality of sequences and respectively perform the plurality of sequences in a plurality of sub-periods selected out of the plurality of sub-periods.

Figure 16A:
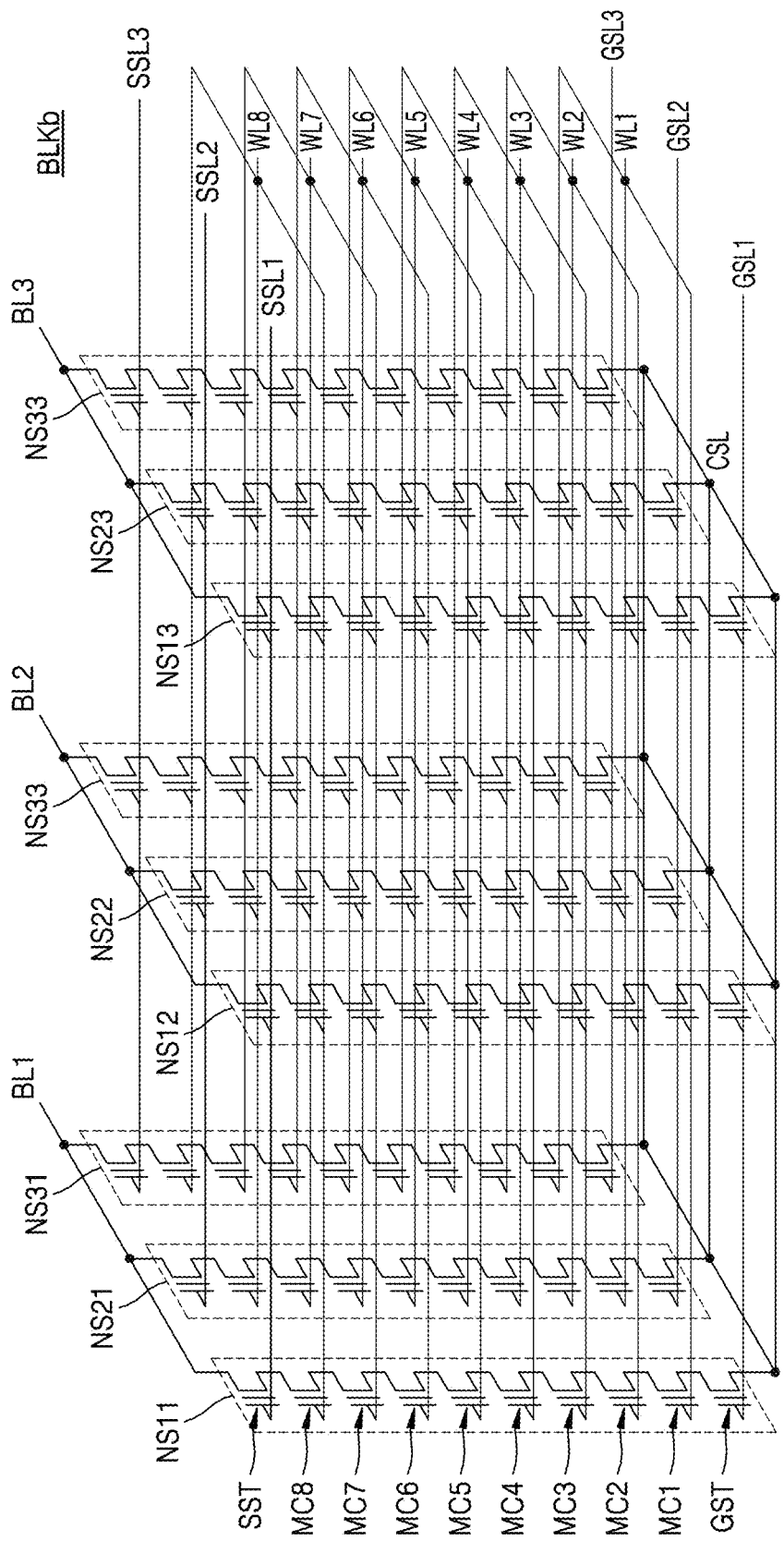
FIG. 16A is a circuit diagram of a memory block according to some example embodiments.
Figure 16B:
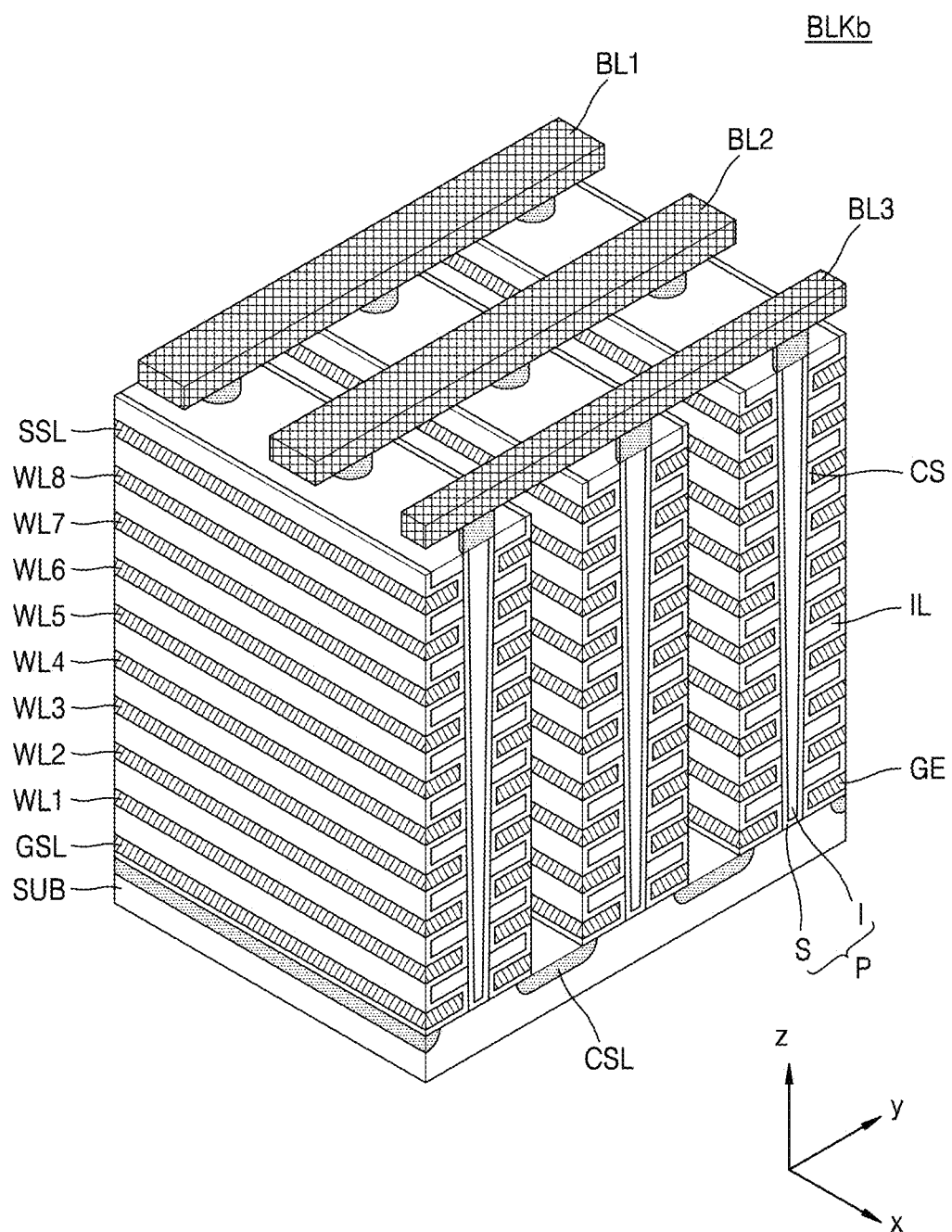
FIG. 16B is a perspective view of the memory block of FIG. 16A.

FIG. 16A is a circuit diagram of a memory block BLKb according to some example embodiments, and FIG. 16B is a perspective view of the memory block BLKb of FIG. 16A.

Referring to FIG. 16, the memory block BLKb may be a NAND flash memory having a vertical structure, and at least one of the memory blocks BLK1 to BLKz shown in FIG. 3 may be implemented as shown in FIG. 16A. The memory block BLKb may include a plurality of NAND cell strings (e.g., NS11 to NS33), a plurality of word lines (e.g., WL1 to WL8), a plurality of bit lines (e.g., BL1 to BL3), a plurality of ground selection lines (e.g., GSL1 to GSL3), a plurality of string selection lines (e.g., SSL1 to SSL3), and a common source line CSL. The number of cell strings, the number of word lines, the number of bit lines, the number of ground selection lines, and the number of string selection lines may vary according to embodiments.

NAND cell strings NS11, NS21, and NS31 may be provided between a first bit line BL1 and the common source line CSL, NAND cell strings NS12, NS22, and NS32 may be provided between a second bit line BL2 and the common source line, and NAND cell strings NS13, NS23, and NS33 may be provided between a third bit line BL3 and the common source line CSL. Each NAND cell string (e.g., NS11) may include a string select transistor SST, a plurality of memory cells MC1 to MC8, and a ground select transistor GST, which are connected in series. In some example embodiments, dummy cells may be arranged among the string selection transistor SST, the plurality of memory cells MC1 to MC8, and the ground selection transistor GST. Hereinafter, a NAND cell string will be referred to as a cell string for brevity.

The string selection lines SSL1 to SSL3 may be separated from each other, and the string selection transistor SST may be connected to a corresponding one of the string selection lines SSL1 to SSL3. The ground selection lines GSL1 to GSL3 may be separated from each other, and the ground selection transistor GST may be connected to a corresponding one of the ground selection lines GSL1 to GSL3. The string selection transistor SST may be connected to a corresponding one of the bit lines BL1 to BL3, and the ground selection transistor GST may be connected to the common source line CSL.

The plurality of memory cells MC1 to MC8 may be connected to the plurality of word lines WL1 to WL8 corresponding respectively thereto. Memory cells located at the same height from a substrate (or the ground selection transistors GST) may be connected in common to one word line, and memory cells located at different heights may be respectively connected to different word lines WL1 to WL8. For example, first memory cells MC1 may be connected in common to a first word line WL1, and second memory cells MC2 may be connected in common to a second word line WL2.

Referring to FIG. 16B, the memory block BLKb may be formed in a vertical direction to a substrate SUB. Although FIG. 16B illustrates some example embodiments in which the memory block BLKb includes two selection lines GSL and SSL, eight word lines WL1 to WL8, and three bit lines BL1 to BL3, the number of selection lines, the number of word lines, and the number of bit lines may be actually larger or smaller than in FIG. 16B.

The substrate SUB may be of a first conductivity type (e.g., p type), and a common source line CSL may be provided on the substrate SUB. The common source line CSL may extend in a first direction (e.g., Y direction) and be doped with impurities of a second conductivity type (e.g., n type). A plurality of insulating films IL may extend in the first direction and be sequentially provided in a third direction (e.g., Z direction) on a region of the substrate SUB between two adjacent common source lines CSL. Also, the plurality of insulating films IL may be spaced a predetermined distance apart from each other in the third direction. For example, the plurality of insulating films IL may include an insulating material (e.g., silicon oxide).

A plurality of pillars P, each of which may be provided on a region of the substrate SUB between two adjacent common source lines CSL, may be sequentially located in the first direction and pass through the plurality of insulating films IL in the third direction. For example, the plurality of pillars P may pass through the plurality of insulating films IL and contact the substrate SUB. For example, a surface layer S of each of the pillars P may include a silicon material of the first conductivity type and function as a channel region. Meanwhile, an inner layer I of each of the pillars P may include an insulating material (e.g., silicon oxide) and/or an air gap.

A charge storage layer CS may be provided in a region between two adjacent common source lines CSL along exposed surfaces of the insulating films IL, the pillars P, and the substrate SUB. The charge storage layer CS may include a gate insulating layer (or referred to as a 'tunneling insulating layer'), a charge trap layer, and a blocking insulating layer. For example, the charge storage layer CS may include an oxide-nitride-oxide (ONO) structure. Also, a gate electrode GE including the selection lines GSL and SSL and the word lines WL1 to WL8 may be provided in a region between two adjacent common source lines CSL on an exposed surface of the charge storage layer CS.

Drains or drain contacts DR may be provided on the plurality of pillars P, respectively. For example, the drains or drain contacts DR may include a silicon material doped with impurities of the second conductivity type. Bit lines BL1 to BL3 may be provided on the drains DR. The bit lines BL1 to BL3 may extend in a second direction (e.g., X direction) and be spaced a predetermined distance apart from each other in the first direction.

Figure 17:
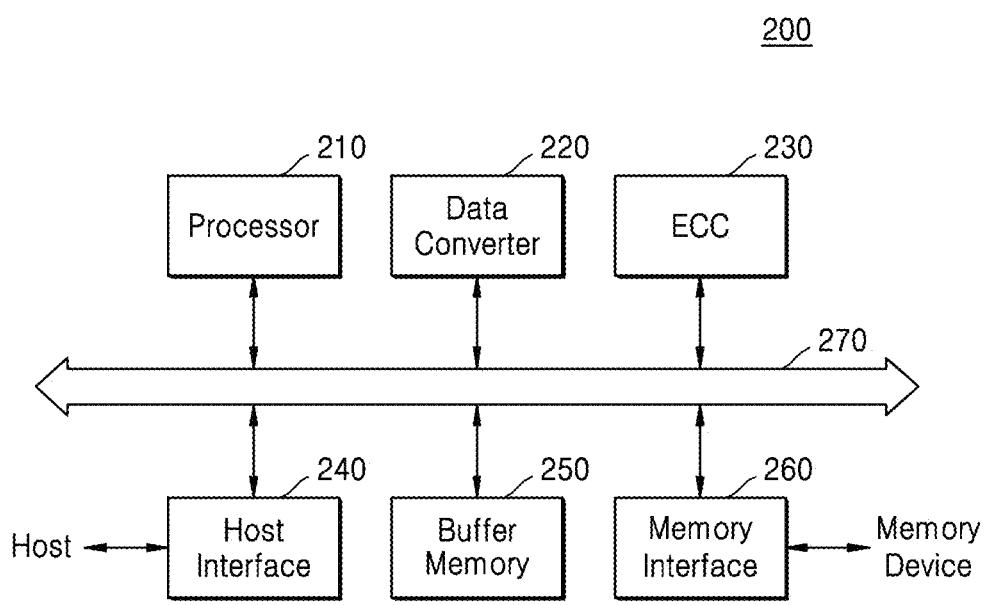
FIG. 17 is a block diagram of a memory controller according to some example embodiments.

FIG. 17 is a block diagram of a memory controller 200 according to some example embodiments.

Referring to FIG. 17, the memory controller 200 may include a processor 210, a data converter 220, an error correction circuit (ECC) 230, a host interface 240, a buffer memory 250, and a memory interface 260, which may transmit and receive data to and from each other through a bus 270.

The processor 210 may control the overall operation of the memory controller 200 and perform a logical operation. In some example embodiments, the processor 210 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The data converter 220 may convert data received from an external host based on a first state data order (e.g., a default state data order), which is set considering a coupling effect and an error rate. Also, the data converter 220 may convert data received from a memory device (e.g., the memory device 100 of FIGS. 1 and 30) based on the first state data order and output the converted data to the external host.

The ECC 230 may perform an error correction operation. The ECC 230 may perform an error correction encoding operation based on data to be written to the memory device 100 through the memory interface 260. Data on which an error correction encoding operation has been performed may be transmitted to the memory device 100 through the memory interface 260. The ECC 230 may perform an error correction decoding operation on data, which is received through the memory interface 260 from the memory device 100. For example, the ECC 230 may be included as a component in the memory interface 260.

The buffer memory 250 may temporarily store data to be written to the memory device 100 or data received from the memory device 100. Also, the buffer memory 250 may temporarily store data required for an operation of the memory controller 200. In some example embodiments, the buffer memory 250 may be used for an operation memory or a cache memory.

The memory controller 200 may communicate with the external host through the host interface 240 and communicate with the memory device 100 through the memory interface 260.

The host interface 240 may be configured to communicate with the external host via the control of the processor 210. The host interface 240 may be configured to communicate with the external host using at least one of various communication methods, such as a USB, SATA, serial attached small-computer system interface (SCSI) (SAS), a high-speed interchip (HSIC), SCSI, peripheral component interconnection (PCI), PCI express (PCIe), non-volatile memory express (NVMe), universal flash storage (UFS), secure digital (SD), multi-media card (MMC), embedded MMC (eMMC), dual in-line memory module (DIMM), registered DIMM (RDIMM), and load reduced DIMM (LRDIMM).

The memory interface 260 may be configured to communicate with the memory device 100 via the control of the processor 210. The memory interface 260 may communicate a command, an address, and data with the memory device 100 through an I/O channel. The memory interface 127 may communicate a control signal with the memory device 100 through a control channel.

Figure 18:
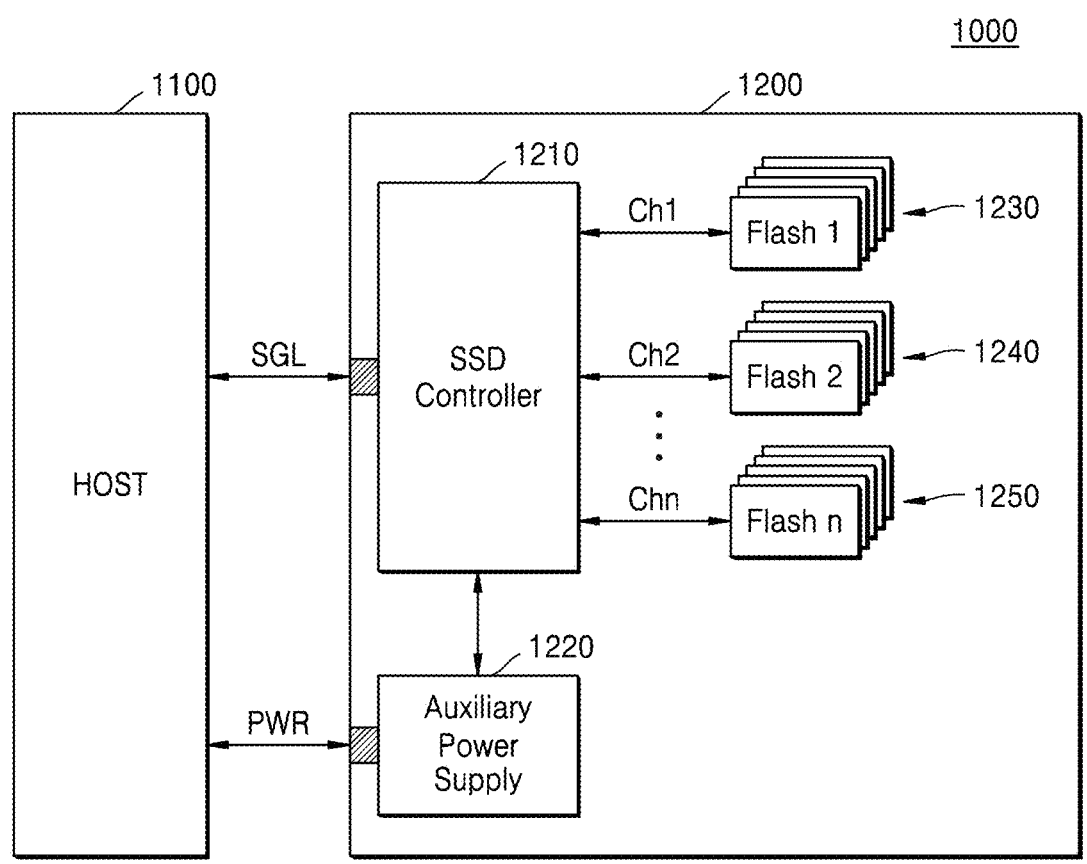
FIG. 18 is a block diagram of a solid-state drive (SSD) system according to some example embodiments.

FIG. 18 is a block diagram of a solid-state drive (SSD) system 1000 according to some example embodiments.

Referring to FIG. 18, the SSD system 1000 may include a host 1100 and an SSD 1200. The SSD 1200 may transmit and receive signals to and from the host 1100 through a signal connector and receive power PWR through a power connector. The SSD 1200 may include an SSD controller 1210, an auxiliary power supply 1220, and a plurality of flash memory devices (e.g., 1230, 1240, and 1250). In some example embodiments, the memory system 10 of FIG. 1 may be applied to the SSD 1200. For example, the memory device 100 of FIGS. 1 and 3 may be applied to at least one of the plurality of flash memory devices 1230 to 1250. At least one of the plurality of flash memory devices 1230 to 1250 may perform a state data reordering operation to reduce a time required for a program operation. The at least one of the plurality of flash memory devices 1230 to 1250 may perform the state data reordering operation simultaneously with the program operation. Thus, program performance may be improved, and a data input/output (I/O) speed of the SSD 1200 may be increased.

The memory device and the memory system according to the embodiments may be mounted on and/or applied to not only the SSD 1200 shown in FIG. 18 but also a memory card system, a computing system, a UFS, and an eMMC. Also, a method of operating a memory device according to some example embodiments may be applied to various kinds of electronic systems on which a non-volatile memory is mounted.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

While the inventive concepts has been particularly shown and described with reference to embodiments thereof, it will be understood that various changes in form and details may be made therein without departing from the spirit and scope of the following claims.

What is claimed is:

1. A non-volatile memory device comprising:
    a memory cell array including a plurality of memory cells, each memory cell configured to be programmed to one state of a plurality of states;
    a page buffer circuit including a plurality of page buffers, each page buffer configured to store received data as state data indicating a target state of a corresponding memory cell of the plurality of memory cells, the page buffer circuit being configured to perform a state data reordering operation of changing a first state data order indicating reference mapping between a plurality of data values of the state data and the plurality of states into a second state data order during at least one verification period among a plurality of verification period in which a verification operation is performed on selected memory cells of the plurality of memory cells; and
    a reordering control circuit configured to control the page buffer circuit to perform the state data reordering operation simultaneously with the verification read operation.

2. The non-volatile memory device of claim 1, wherein each of the plurality of page buffers includes data latches configured to respectively store bits of the state data, and
    the state data reordering operation includes a plurality of dump operations on the data latches.

3. The non-volatile memory device of claim 2, wherein a bit of at least one of data latches is changed when a verification voltage is applied to the selected memory cell during the at least one verification period.

4. The non-volatile memory device of claim 3, a state data reordering time during which the state data reordering is performed is shorter than or equal to a time during which the verification voltage is applied in the at least one verification period.

5. The non-volatile memory device of claim 1, wherein the at least one verification period is after a program voltage application period in which a first program voltage is applied to the selected memory cell.

6. The non-volatile memory device of claim 1, wherein after the at least one verification period, a second program voltage is applied to the selected memory cells based on the second state data order.

7. The non-volatile memory device of claim 1, wherein the page buffer circuit is configured to perform first operations among a plurality of operations included in the state data reordering operation during the at least one verification period.

8. The non-volatile memory device of claim 7, wherein the page buffer circuit is configured to perform second operations among a plurality of operations during at least one period of the plurality of program voltage application periods in which a program voltage is applied to the selected memory cells.

9. The non-volatile memory device of claim 8, wherein the at least one period of the plurality of program voltage application periods is prior to the at least one verification period.

10. The non-volatile memory device of claim 7, wherein the page buffer circuit is configured to perform second operations among a plurality of operations during at least one period of a plurality of program voltage application periods, a plurality of program recovery periods, and the plurality of verification periods.

11. A method of operating a non-volatile memory device, the method comprising:
    receiving data;
    storing the data as state data in a plurality of page buffers connected to a memory cell array;
    applying a first program voltage to a plurality of memory cells of a memory cell array based on the state data stored in the plurality of page buffers;
    applying a verification voltage to the plurality of memory cells of the memory cell array; and
    performing a state data reordering operation during a verification period in which the verification voltage is applied to the plurality of memory cells, the state data reordering operation including changing a data value of the state data stored in each of the plurality of page buffers.

12. The method of claim 11, wherein the reordering of the state data includes performing a plurality of dump operations of a plurality of data latches included in each of the plurality of page buffers and changing first state data stored in the data latches into second state data.

13. The method of claim 12, wherein a bit of at least one of data latches is changed when a verification voltage is applied to the selected memory cell.

14. The method of claim 11, further comprising:
    dividing the reordering of the state data into at least two reordering sequences based on a time required to perform the reordering of the state data exceeding the verification period; and
    performing the at least two sequences, respectively, in the verification period and at least one period of a plurality of program application periods in which a program voltage is applied to the plurality of memory cells.

15. The method of claim 11, wherein, further comprising:
    applying a second program voltage to the plurality of memory cells of a memory cell array based on changed state data after the verification period.

16. A memory system comprising:
    a memory controller configured to convert data received from a host, based on a first state data order to generate write data; and
    a non-volatile memory device configured to
    store the write data received from the memory controller as state data in each of a plurality of page buffers,
    apply a first program voltage to a plurality of memory cells of a memory cell array based on the state data,
    apply a verification voltage to the plurality of memory cells of the memory cell array, and perform a state data reordering operation during a verification period in which the verification voltage is applied to the plurality of memory cells, the state data reordering operation including changing a value of state data stored in each of the plurality of page buffers to change the first state data order into a second state data order, the second state data order being appropriate for a program sequence.

17. The memory system of claim 16, wherein each of the plurality of page buffers includes data latches configured to respectively store bits of the state data, and
a bit of at least one of data latches is changed when a verification voltage is applied to the selected memory cell.

18. The memory system of claim 16, wherein the non-volatile memory device is further configured to apply a second program voltage to the plurality of memory cells of a memory cell array based on changed state data.

19. The memory system of claim 16, wherein,
based on a time required for the state data reordering operation exceeding the verification period, the non-volatile memory device is configured to
divide the state data reordering operation into at least two sequences, and
perform the at least two sequences, respectively, in the verification period and at least one other period.

20. The memory system of claim 19, wherein, the at least one other period includes at least one period of a plurality of program application periods in which a program voltage is applied to the plurality of memory cells.

* * * * *